United States Patent
Soltani et al.

(10) Patent No.: US 11,054,673 B2
(45) Date of Patent: Jul. 6, 2021

(54) PHOTONIC DEVICES

(71) Applicants: Raytheon BBN Technologies Corp., Cambridge, MA (US); Raytheon Company, Waltham, MA (US)

(72) Inventors: Mohammad Soltani, Belmont, MA (US); Eduardo M. Chumbes, Andover, MA (US)

(73) Assignees: Raytheon BBN Technologies Corp., Cambridge, MA (US); Raytheon Company, Waltham, MA (US)

( * ) Notice: Subject to any disclaimer, the term of this patent is extended or adjusted under 35 U.S.C. 154(b) by 0 days.

(21) Appl. No.: 16/896,735

(22) Filed: Jun. 9, 2020

(65) Prior Publication Data

US 2020/0301175 A1  Sep. 24, 2020

Related U.S. Application Data

(62) Division of application No. 16/227,846, filed on Dec. 20, 2018.

(Continued)

(51) Int. Cl.
*G01N 21/41* (2006.01)
*G02F 1/017* (2006.01)
(Continued)

(52) U.S. Cl.
CPC ...... *G02F 1/01716* (2013.01); *G02F 1/01708* (2013.01); *H01S 5/125* (2013.01);
(Continued)

(58) Field of Classification Search
CPC ............ G02F 1/01716; G02F 1/01708; G02F 2202/108; H01S 5/125; H01S 5/343; H01S 5/18347; H01S 5/04253; H01S 5/22; H01S 5/04257; H01S 5/3214; H01S 5/18361; H01S 5/3211; H01S 5/34333;
(Continued)

(56) References Cited

U.S. PATENT DOCUMENTS

| | | |
|---|---|---|
| 5,301,202 A | 4/1994 | Harder et al. |
| 6,160,833 A | 12/2000 | Floyd et al. |

(Continued)

FOREIGN PATENT DOCUMENTS

| | | |
|---|---|---|
| DE | 1020 11119660 A1 | 5/2013 |
| DE | 10 2015 116 068 A1 | 3/2017 |

(Continued)

OTHER PUBLICATIONS

Atabaki, et al.; "Integrating photonics with silicon nanoelctronics for the next generation of systems on a chip"; Nature; vol. 556; pp. 349-358; Apr. 19, 2018; 10 Pages.

(Continued)

*Primary Examiner* — Ellen E Kim
(74) *Attorney, Agent, or Firm* — Daly, Crowley, Mofford & Durkee, LLP

(57) ABSTRACT

Photonic devices having $Al_{1-x}Sc_xN$ and $Al_yGa_{1-y}N$ materials, where Al is Aluminum, Sc is Scandium, Ga is Gallium, and N is Nitrogen and where $0<x\leq0.45$ and $0\leq y\leq1$.

11 Claims, 16 Drawing Sheets

Related U.S. Application Data

(60) Provisional application No. 62/670,273, filed on May 11, 2018.

(51) Int. Cl.
*H01S 5/125* (2006.01)
*H01S 5/343* (2006.01)
*H01L 29/778* (2006.01)
*H01L 29/20* (2006.01)

(52) U.S. Cl.
CPC .... *G02F 2202/108* (2013.01); *H01L 29/2003* (2013.01); *H01L 29/7783* (2013.01); *H01S 5/343* (2013.01)

(58) Field of Classification Search
CPC ............. H01L 29/7783; H01L 29/2003; H01L 29/66462; H01L 29/0843; H01L 29/7786; H01L 29/201
See application file for complete search history.

(56) References Cited

U.S. PATENT DOCUMENTS

| | | | |
|---|---|---|---|
| 6,495,894 B2 | 12/2002 | Shibata et al. | |
| 6,534,797 B1* | 3/2003 | Edmond | H01L 33/007 257/103 |
| 7,358,541 B2* | 4/2008 | Seong | H01L 33/405 257/778 |
| 7,751,455 B2 | 7/2010 | Kneissl | |
| 8,030,667 B2* | 10/2011 | Song | H01L 33/32 257/79 |
| 9,335,262 B2 | 5/2016 | Wunderer et al. | |
| 2006/0034566 A1 | 2/2006 | Wakita et al. | |
| 2006/0205127 A1 | 9/2006 | Kwon et al. | |
| 2008/0095492 A1 | 4/2008 | Son et al. | |
| 2011/0002352 A1 | 1/2011 | Takiguchi | |
| 2015/0160530 A1 | 6/2015 | Han et al. | |
| 2016/0190384 A1 | 6/2016 | Huang et al. | |
| 2017/0294529 A1* | 10/2017 | Beam, III | H01L 29/201 |
| 2018/0120422 A1 | 5/2018 | Flow et al. | |
| 2018/0130883 A1 | 5/2018 | Hardy et al. | |
| 2018/0203262 A1 | 7/2018 | Epping et al. | |
| 2019/0035895 A1* | 1/2019 | Xie | H01L 29/778 |
| 2019/0227233 A1 | 7/2019 | Clark et al. | |
| 2019/0346705 A1 | 11/2019 | Soltani et al. | |

FOREIGN PATENT DOCUMENTS

| | | |
|---|---|---|
| EP | 2 779 213 A1 | 7/2014 |
| JP | 2014 222331 A | 11/2014 |

OTHER PUBLICATIONS

Bruch, et al.; Electrochemically sliced low loss AlGaN optical microresonators; Applied Physics Letters 110, 021111; Jan. 10, 2017; 4 Pages.

Guo, et al.; "MBE-Regrown Ohmics in InAlN HEMTs With a Regrowth Interface Resistance of 0.05 Ω • mm"; IEEE Electron Device Letters; vol. 33; No. 4; pp. 525-527; Apr. 2012; 3 Pages.

Hui, et al.; "GaN-based waveguide devices for long-wavelength optical communications"; Applied Physics Letters; vol. 82; No. 9; pp. 1326-1328; Mar. 3, 2003; 3 Pages.

Kao, et al.; "Electroabsorption modulators based on bulk GaN films and GaN/AlGaN multiple quantum wells"; Journal of Applied Physics 109, 083102; 2011; 5 Pages.

Scheibenzuber; "GaN-Based Laser Diodes"; Towards Longer Wavelengths and Short Pulses; Springer Theses; 2012; 107 Pages.

Siyuan Zhang et al., Tunable optoelectronic and ferroelectric properties in Sc-based III-nitrides, Journal of Applied Physics, vol. 114, No. 13, Oct. 7, 2013, 12 pages.

Matthew T. Hardy et al., Epitaxial ScAlN grown by molecular beam epitaxy on GaN and SiC substrates, Applied Physics Letters, vol. 110, 2017, 5 pages.

Agne 2UKAUSKAITE et al., Stabilization of wurtzite Sc0.4Al0.6N in pseudomorphic epitaxial Sc$_x$Al$_{1-x}$N/In$_y$Al$_{1-y}$N superlattices, Science Direct, Apr. 15, 2015, 10 pages.

Steigerwald, et al.; "III-V Nitride Semiconductors for High-Performance Blue and Green Light-Emitting Devices"; JOM, 49 (9); 1997; 5 Pages.

Xiong, et al.; "Aluminum nitride as a new material for chip-scale optomechanics and nonlinear optics"; New Journal of Physics; vol. 14; Sep. 2012; 30 Pages.

Non Final Office Action dated Jan. 2, 2020, U.S. Appl. No. 16/227,764, 16 pages.

Notification of Transmittal of the International Search Report & Written Opinion of the ISA dated Aug. 7, 2019 for International Application No. PCT/US2019/029871; 1 Page.

International Search Report dated Aug. 7, 2019 for International Application No. PCT/US2019/029871; 5 Pages.

Written Opinion of the ISA dated Aug. 7, 2019 for International Application No. PCT/US2019/029871; 7 Pages.

Restriction Requirement dated Apr. 15, 2020, U.S. Appl. No. 16/227,846, 5 pages.

Response to Restriction Requirement dated Jun. 5, 2020, U.S. Appl. No. 16/227,846, 3 pages.

Non Final Office Action dated Aug. 14, 2020, U.S. Appl. No. 16/227,846, 14 pages.

Pashchenko et al, "Properties of AlScN thin films for hybrid BAW/SAW resonator fabrication" (2017 Joint Conference of the European Frequency and Time Forum and IEEE International Frequency Control Symposium). (Year: 2017), 2 pages.

Final Office Action dated Mar. 10, 2021, U.S. Appl. No. 16/227,846, 12 pages.

Notification Concerning Transmittal of the International Preliminary Report on Patentability (Chapter I of the Patent Cooperation Treaty), PCT/US2019/029869, dated Nov. 26, 2020, 1 page.

International Preliminary Report on Patentability, PCT/US2019/029869, dated Nov. 17, 2020, 1 page.

Written Opinion of the International Searching Authority, PT/US2019/029869, dated Nov. 26, 2020, 8 pages.

Notification Concerning Transmittal of the International Preliminary Report on Patentability (Chapter I of the Patent Cooperation Treaty), PCT/US2019/029871, dated Nov. 26, 2020, 1 page.

International Preliminary Report on Patentability, PCT/US2019/029871, dated Nov. 17, 2020, 1 page.

Written Opinion of the International Searching Authority, PT/US2019/029871, dated Nov. 26, 2020, 4 pages.

Response to Non Final Office Action dated Jun. 29, 2020, U.S. Appl. No. 16/227,764, 13 pages.

* cited by examiner

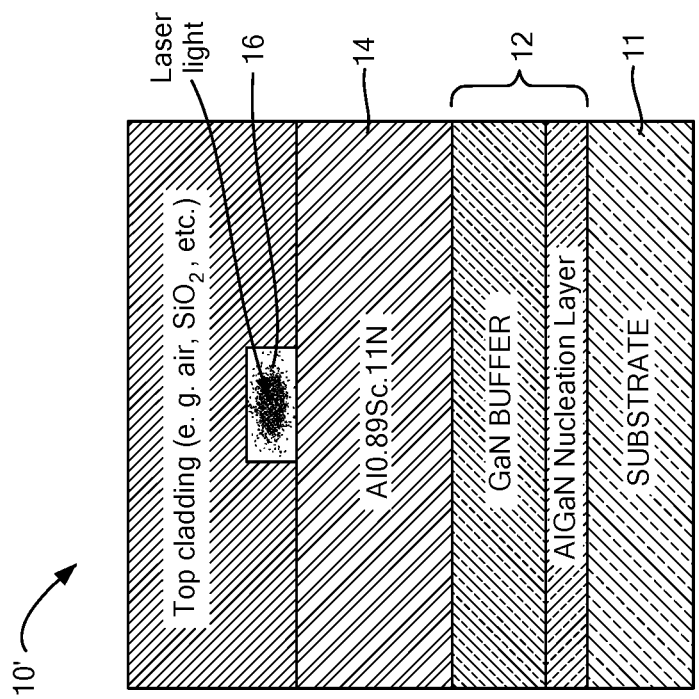
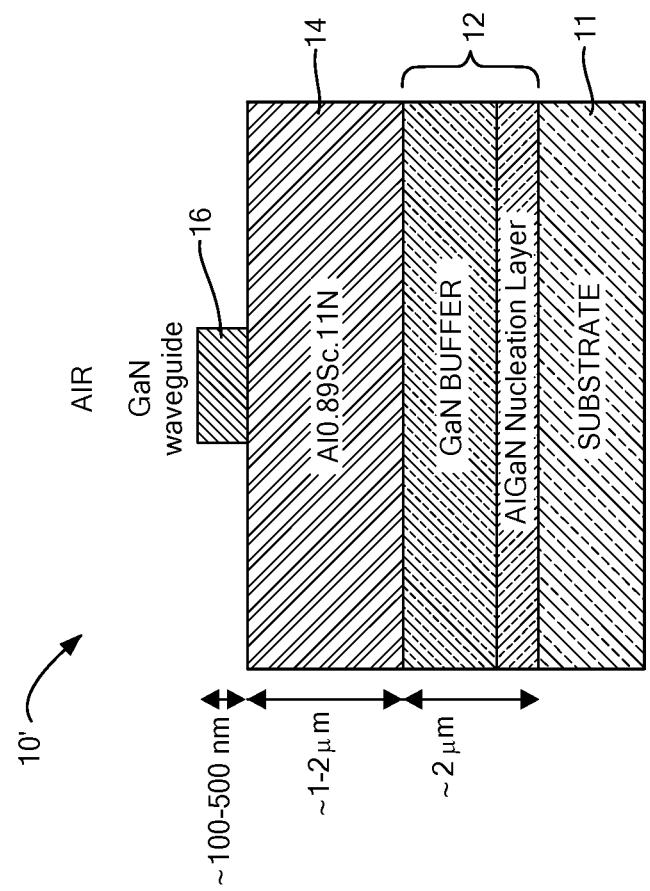
FIG. 3A
FIG. 3B

PHOTONIC DEVICES

CROSS REFERENCE TO RELATED APPLICATION

This application is a divisional of U.S. patent application Ser. No. 16/227,846, filed on Dec. 20, 2018 which claims the benefit of U.S. Provisional Patent Application Ser. No. 62/670,273, filed on May 11, 2018, both which are incorporated herein by reference in its entirety.

TECHNICAL FIELD

This disclosure relates generally to photonic devices. The disclosure also relates to structures adapted to have a photonic device and semiconductor electronic device disposed on a common single crystal layer. The disclosure also relates to structures having photonic devices and Group III-N semiconductors.

BACKGROUND OF THE INVENTION

As is known in the art, photonic devices are used to: generate photons, as with a laser; modify the propagation of photons, as with an amplifier, modulator, switch, or electro-optical device; or, detect photons, as with a photon detector. As is also known in the art, many of these photonic devices are formed using a vertical stack of horizontally disposed layers of different materials and include: a photonic waveguiding layer through which photons are generated and/or propagate; and a cladding layer disposed on the photonic waveguiding layer; the cladding layer having an index of refraction lower than the index of refraction of the photonic waveguiding layer at the operating wavelength of the photonic device to confine the photons within the photonic waveguiding layer and suppress leakage of photons outside the photonic waveguiding layer. As is also know in the art, structures that integrate a plurality of photonic devices are known as photonic integrated circuit (PIC) or integrated optical circuits.

As is also known electronic integrated circuits are structures which integrate a plurality of active electronic devices, such as transistors, and passive devices, such as resistors, capacitors and inductors. Thus, whereas photonic devices generate, propagate and/or control photons, electronic devices generate, propagate and/or control electrons (and/or holes). One desirable structure would be one that integrated photonic devices with electronic integrated devices both comprising Group III-Nitride semiconductor materials on a common single crystal layer.

A number of attempts to implement Group III-Nitride photonic waveguiding layer/cladding layer have been pursued in the past:

1 Epitaxially growing the photonic waveguiding layer on another wurtzite crystal such as sapphire, or a III-Nitride crystal different than the photonic waveguiding layer, and with a refractive index lower than the photonic waveguiding layer, 2 Transferring and bonding the III-Nitride photonic waveguiding layer to another substrate such as Silicon Dioxide ($SiO_2$), 3 Sputtering of III-Nitride on $SiO_2$ substrate, 4 Epitaxially growing the III-Nitride photonic waveguiding layer on another crystalline family material, such as silicon.

Among the above approaches, (1) is widely and technologically attractive as the crystalline photonic waveguiding layer is grown on another crystal of the same family. However, a major challenge has been the crystalline lattice mismatch between the photonic waveguiding layer and the underneath cladding layer which results in the generation of high density of crystalline dislocations limiting the growth thickness of the photonic waveguiding layer. While Approach (2) can provide a viable platform for photonic devices, its integration with Group III-N electronic devices and circuits is difficult. Approach (3) can yield the single crystalline material in the growth direction; in the lateral direction, it is amorphous or polycrystalline resulting in relatively high loss and electronic device integration difficulties. Approach (4) suffers from high dislocation density when growing Group III-Nitride on Si. In addition, Silicon (Si) has a larger refractive index than GaN and AlGaN, and so it cannot be an effective optical cladding layer for GaN and AlGaN in many applications.

As mentioned above, photonic devices include lasers and modulators which include a photonic waveguiding layer and cladding layers. One such photonic modulator is a Group III-Nitride quantum well electro-optic modulator (including both in-plane (light propagates parallel to the plane of the waveguiding and cladding layers) and out-of-plane (light propagates perpendicular to the plane of the cladding layer) guided waves) and one type of laser is a Group III-Nitride quantum well (both in-plane lasing and out-of-plane, or vertically, emitting lasing). These quantum well electro-optic modulators include a photonic waveguiding layer (sometimes also referred to as a photonic waveguiding layer that includes the quantum well structure) and a cladding layer to control propagation modes within the photonic waveguiding layer. To ensure strong control or confinement of this propagation mode in the photonic waveguiding layer the difference in refractive index between the photonic waveguiding layer and cladding layers needs to be sufficiently large; for example >~0.2 for operation in the blue-green wavelengths. For such devices based on III-Nitrides materials employing Aluminum Nitride (AlN), Gallium Nitride (GaN) and/or Indium Nitride (InN) and their respective ternary or quaternary alloys, maximizing this difference unfortunately leads to layers for the photonic waveguiding layer and cladding to be highly structurally mismatched thus limiting the thicknesses of these layers to be much thinner than desired/required to avoid any significant generation of lattice defects and dislocations in the device. This is presently a major challenge for such devices to be built on Group III-Nitride materials.

There have been optical modulators and lasers out of these materials, including Gallium Nitride (GaN) and Indium Gallium Nitride (InGaN). However, some major challenge limits their efficiency as well as their compatibility for either in-plane or out-of-plane operation. These challenges include:

1 The large crystalline lattice mismatch between the stack of quantum well layers forming the modulator, which set a limit on increasing the layer thickness as well as reduces the efficiency of the quantum well for interaction with light. This becomes particularly troublesome when going to wavelengths longer than blue (e.g. green) which requires thicker quantum wells, thereby efficiency in green wavelength lasers and modulators can drop quite rapidly.

2 For in-plane waveguide modulators as well as in-plane lasers, a fundamental requirement for a photonic waveguiding layer is to have a refractive index larger than the cladding material, while being closely lattice matched to the underneath or upper material cladding which is also crystalline. However, a major challenge has been the crystalline lattice mismatch between the photonic waveguiding layer and the cladding material which limits the growth thickness of the photonic waveguiding layer to avoid onset of dislocation generation in the crystal degrading the overall performance of the modulator and lasers.

For out-of-plane modulators and vertical emitting lasers a stack of distributed Bragg reflector (DBR) layers is needed to vertically confine the light, the crystalline lattice mismatch between the layer stacks sets a limit on the thickness of the DBR layers, such that increasing the layer thickness reduces the material quality and results in large optical absorption and scattering. Therefore, making DBR layers with desired thickness becomes quite challenging, particularly as the operation wavelength increases. In prior art making high efficient lasers at longer wavelengths (~500 nm and above) based on Group III-Nitride structures has been quite challenging due to the crystalline lattice mismatch and limited thickness of the DBR.

Recently the general optical and electrical properties of AlScN have been theoretically and experimentally investigated in the literature (see M. A. Caro et al, "Piezoelectric Coefficients and Spontaneous Polarization of ScAlN," J. Phys. Condens. Matter 27, 245901 (2015); M. A. Moram et al, "ScGaN and ScAlN: Emerging Nitride Materials," J. Mater. Chem. A 2, 6042 (2014); R. Deng, S. R. Evans, and D. Gall, "Bandgap in $Al_{1-x}Sc_xN$," App. Phys. Lett. 102, 112103 (2013); and R. Deng, K. Jiang, and D. Gall, "Optical phonon modes in $Al_{1-x}Sc_xN$," J. App. Phys. 115, 013506 (2014)).

SUMMARY OF THE INVENTION

In accordance with the present disclosure, a photonic device is provided comprising Scandium.

In one embodiment, a photonic device is provided having a photonic waveguiding layer and a cladding layer disposed on the photonic waveguiding layer, and wherein the cladding layer is a material comprising Scandium.

In one embodiment, the cladding section is a material comprising $Al_{1-x}Sc_xN$ material where: $0<x\leq0.45$.

In one embodiment, the photonic waveguiding layer is a material comprising $Al_yGa_{1-y}N$ layer, where Al is Aluminum, Ga is Gallium, N is Nitrogen and where: $0\leq y\leq 1$.

In one embodiment, a photonic device is provided having an $Al_{1-x}Sc_xN$ layer and an $Al_yGa_{1-y}N$ layer, where Al is Aluminum, Sc is Scandium, N is Nitrogen and where: $0<x\leq0.45$ and $0\leq y\leq 1$.

In one embodiment, a photonic device is provided comprising: an Aluminum Scandium Nitride cladding layer.

In one embodiment, a structure is provided comprising: a photonic waveguiding layer; and an Aluminum Scandium Nitride cladding layer disposed on the photonic waveguiding layer.

In one embodiment, a structure is provided comprising: a layer comprising single crystalline photonic waveguiding layer; and a single crystalline Aluminum Scandium Nitride cladding layer disposed on the single crystal photonic waveguiding layer.

In one embodiment, the photonic waveguiding layer comprises a Group III-Nitride compound and the cladding layer comprises Aluminum Scandium Nitride.

In one embodiment a structure is provided having a photonic device and an electronic device on a common single crystal structure, such single crystal structure comprising: a Group III-N compound and a layer of Aluminum Scandium Nitride, the layer of Aluminum Scandium Nitride being common to the photonic device and an electronic device.

In one embodiment, a structure is provided having a HEMT and a photonic device, the structure comprising: a Group III-N layer photonic waveguiding layer; an $Al_{1-x}Sc_xN$ layer disposed on a surface of the Group III-N layer; wherein the HEMT comprises one portion of the $Al_{1-x}Sc_xN$ layer and the photonic waveguiding layer comprises a different portion of the surface of the $Al_{1-x}Sc_xN$ layer, where $0<x\leq0.45$.

In one embodiment, a structure is provided having an electronic device and a photonic device, the structure comprising: a Group III-N layer; and an $Al_{1-x}Sc_xN$ layer on a surface of the Group III-N layer, where: $0<x\leq0.45$.

In one embodiment, the electronic device has a heterojunction through which carriers pass between a pair of regions through a channel under control of a control signal fed to the electronic device.

In one embodiment, the electronic device is a HEMT.

In one embodiment, a photonic integrated circuits platform is provided comprising: a Group III-Nitride layer of $Al_{1-x}Sc_xN$; and a photonic waveguiding layer of $Al_yGa_{1-y}N$, where: $0<x\leq0.45$ and $0\leq y\leq 1$.

In one embodiment, a Group III-Nitride quantum well electro-optic modulator is provided comprising a cladding layer comprising an $Al_{1-x}Sc_xN$.

In one embodiment, a Group III-Nitride quantum well laser is provided comprising distributed Bragg reflectors (DBR), such reflectors comprising $Al_{1-x}Sc_xN$.

In accordance with present disclosure, a photonic device is provided having a quantum well photonic waveguiding layer comprises: a Group III-N material; and a $Al_{1-x}Sc_xN$ cladding layer disposed on the quantum well photonic waveguiding layer, where: $0<x\leq0.45$, the $Al_{1-x}Sc_xN$ cladding layer having a lower refractive index than the index of refraction of a the quantum well photonic waveguiding layer.

In one embodiment, a Group III-Nitride quantum well waveguiding layer is provided having a cladding layer disposed on the Group III-Nitride quantum well layer waveguiding layer comprising $Al_{1-x}Sc_xN$, where: $0<x\leq0.45$.

In one embodiment, a Group III-Nitride quantum well electro-optic modulator is provided having: a photonic waveguiding layer; and cladding layer disposed on the photonic waveguiding layer, the cladding layer comprising $Al_{1-x}Sc_xN$, where: $0<x\leq0.45$.

In one embodiment, a photonic device is provided having a Group III-Nitride quantum well photonic waveguiding layer and a distributed Bragg reflector (DBR), such DBR comprising $Al_{1-x}Sc_xN$, where: $0<x\leq0.45$.

In one embodiment, a photonic structure device is provided having a Group III-Nitride quantum well photonic waveguiding layer with an $Al_{1-x}Sc_xN$ cladding layer disposed on the quantum well photonic waveguiding layer, where $0<x\leq0.45$ and a refraction index difference $\geq\sim0.2$ while also providing a crystalline lattice matching layer to the quantum well photonic waveguiding layer.

In one embodiment, a photonic device is provided having distributed Bragg reflector (DBR) comprising a stack of Group III-Nitride layers and Aluminum Scandium Nitride layers.

The inventors have recognized that while a major challenge in Group III-Nitride photonic devices is crystalline lattice matching between the quantum well photonic waveguiding layer and the underneath cladding layer resulting in large crystalline dislocation and low material growth quality of the quantum well photonic waveguiding layer, such effects can be circumvented by providing a $Al_yGa_{1-y}N$ quantum well photonic waveguiding layer since such a quantum well photonic waveguiding layer can be perfectly or closely crystalline lattice-matched to the $Al_{1-x}Sc_xN$ cladding layer thereby reducing strain in the structure and any limitations on the growth thickness of the photonic waveguiding layer. Also, the optical refractive index of $Al_{1-x}Sc_xN$ can be smaller than that of $Al_yGa_{1-y}N$ at the operating wavelength of the photonic device. For example for $x\sim 0.1$ and $y\sim 0$, $Al_yGa_{1-y}N$ has a refractive index difference $\sim 0.2$ larger than that of $Al_{1-x}Sc_xN$ which is sufficient to make AlGaN photonic device for use in the ultraviolet to near infrared spectrum.

In this disclosure, the inventors have thus recognized that an Aluminum Scandium Nitride (i.e. $Al_{1-x}Sc_xN$, $0<x\leq 0.45$) cladding with appropriate material composition can be lattice matched to AlGaN photonic waveguiding layer. The refractive index of $Al_{1-x}Sc_xN$ (or equivalently AlScN) can be smaller than that of AlGaN (about $\sim 0.2$ smaller) at the operating wavelength of the photonic device. And finally, since both AlGaN and AlScN are wide bandgap materials, they can have optical transparency down to UV range. Therefore, in accordance with the disclosure a photonic integrated circuit platform or structure is provided comprising an AlGaN photonic waveguiding layer on AlScN cladding layer adapted to operate on a broad optical spectral range from UV to near-infrared. Further, the structure enables integration of photonic devices with electronic devices utilizing AlScN material whereby a broad range of applications that benefit from monolithic electronic/photonic integration of Group III-Nitrides on the same microchip.

Further, with such an arrangement, the efficiency of the modulation as well as lasing is significantly increased. More particularly, a photonic device having GaN/InGaN layers for the quantum well photonic waveguiding layer of the modulator or laser sandwiched between DBR cladding layers made of periodic stack GaN/AlScN cladding layers sections, (one stack of GaN/AlScN DBR layers being disposed above the quantum well photonic waveguiding layer and another stack being disposed below the quantum well photonic waveguiding layer). The optical mode propagation control or confinement for a multiple quantum well in-plane guided-wave modulator and a multiple quantum well in-plane emitting laser is satisfied by total internal reflection knowing that the optical refractive index of $Al_{1-x}Sc_xN$ cladding layer section can be smaller than that of GaN and InGaN of the quantum well photonic waveguiding layer. For example, for $x\sim 0.10$-$0.20$, a refractive index difference of $\sim 0.2$ can be obtained between the $Al_{1-x}Sc_xN$ cladding and the photonic waveguiding layer (the quantum well photonic waveguiding layer) of the modulator or laser, sufficient for optical propagation mode control or confinement over a large optical spectral range in the visible band (e.g. covering blue-green) within the quantum well photonic waveguiding layer. The crystalline lattice matching between the GaN and $Al_{1-x}Sc_xN$ allows design thickness flexibility of the DBR layers to achieve their desired thicknesses. This overcomes another longstanding challenge of making efficient layers of the DBR for Group III-Nitride based vertical cavity lasers and modulators. The Group III-Nitride optical cladding layer, which is Aluminum Scandium Nitride ($Al_{1-x}Sc_xN$, $0<x\leq 0.45$), can be lattice matched to GaN/InGaN photonic waveguiding layer/cladding layer. Further, with such an arrangement, Group III-Nitride quantum well electro-optic modulators (including both in-plane guided wave and out-of-plane) and lasers (both in-plane lasing and vertical emitting lasing) include $Al_{1-x}Sc_xN$ material as cladding layer to provide a lower refractive index to the quantum well region (stacks of GaN and $In_yGa_{1-y}N$ quantum layers here) while providing close crystalline lattice matching to the quantum well region, thereby significantly increasing the efficiency of the modulation as well as lasing.

Still further, with such an arrangement, Group III-Nitride materials can be functional in a broad wavelength range from UV to infrared. Further, the use of a Group III-Nitride optical cladding of Aluminum Scandium Nitride (i.e. $Al_{1-x}Sc_xN$, where $x\leq 0.45$) and with appropriate material composition enables lattice matching to GaN/InGaN photonic waveguiding layer/cladding layer materials. More particularly, with such an arrangement:

1 $Al_{1-x}Sc_xN$, ($0<x<0.2$) with its lower refractive index than GaN/InGaN and lattice matched to it enables in-plane modulator and the in-plane laser with the desired optimal photonic waveguiding layer and cladding layer thickness (e.g. $\sim 200$-$300$ nm photonic waveguiding layer thickness for a wavelength in the blue-green spectrum).

2 The GaN/InGaN quantum well photonic waveguiding layer lattice-matched to $Al_{1-x}Sc_xN$ ($0<x<0.2$) have significantly reduced dislocations leading to improved efficiency of the quantum well photonic waveguiding layer.

3 In the vertical modulator and vertical emitting laser, the DBR includes a stack of GaN/$Al_{1-x}Sc_xN$ cladding layers and such layers can have the desired thickness with higher material layer quality. This is made possible due to crystalline lattice matching between GaN and $Al_{1-x}Sc_xN$, where $0<x<0.2$.

Thus, with such an arrangement, the efficiency of a photonic modulator and laser can be significantly improved.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

FIG. 3A is a simplified, diagrammatical sketch cross sectional view sketch of a photonic device having a $Al_yGa_{1-y}N$ photonic waveguiding layer for $y=0$, the photonic waveguiding layer being disposed on, and lattice matched to an $Al_{0.89}Sc_{0.11}N$ cladding layer epitaxially grown on a single crystal substrate, according to the disclosure;

FIG. 3B is a diagram showing results of a simulation of the optical mode of the GaN photonic device of FIG. 3A for an operation wavelength of 500 nm; with the photonic device width and height of 700 nm and 350 nm, respectively;

FIG. 5J' is simplified cross sectional sketch showing a photonic device having a GaN photonic waveguiding layer on an AlScN underneath cladding layer and integrated with a HEMT transistor according to an alternate embodiment, such cross-section being taken of the disclosure following formation of the structure shown in FIG. 5I;

Like reference symbols in the various drawings indicate like elements.

DETAILED DESCRIPTION

Figures 1, 1A:
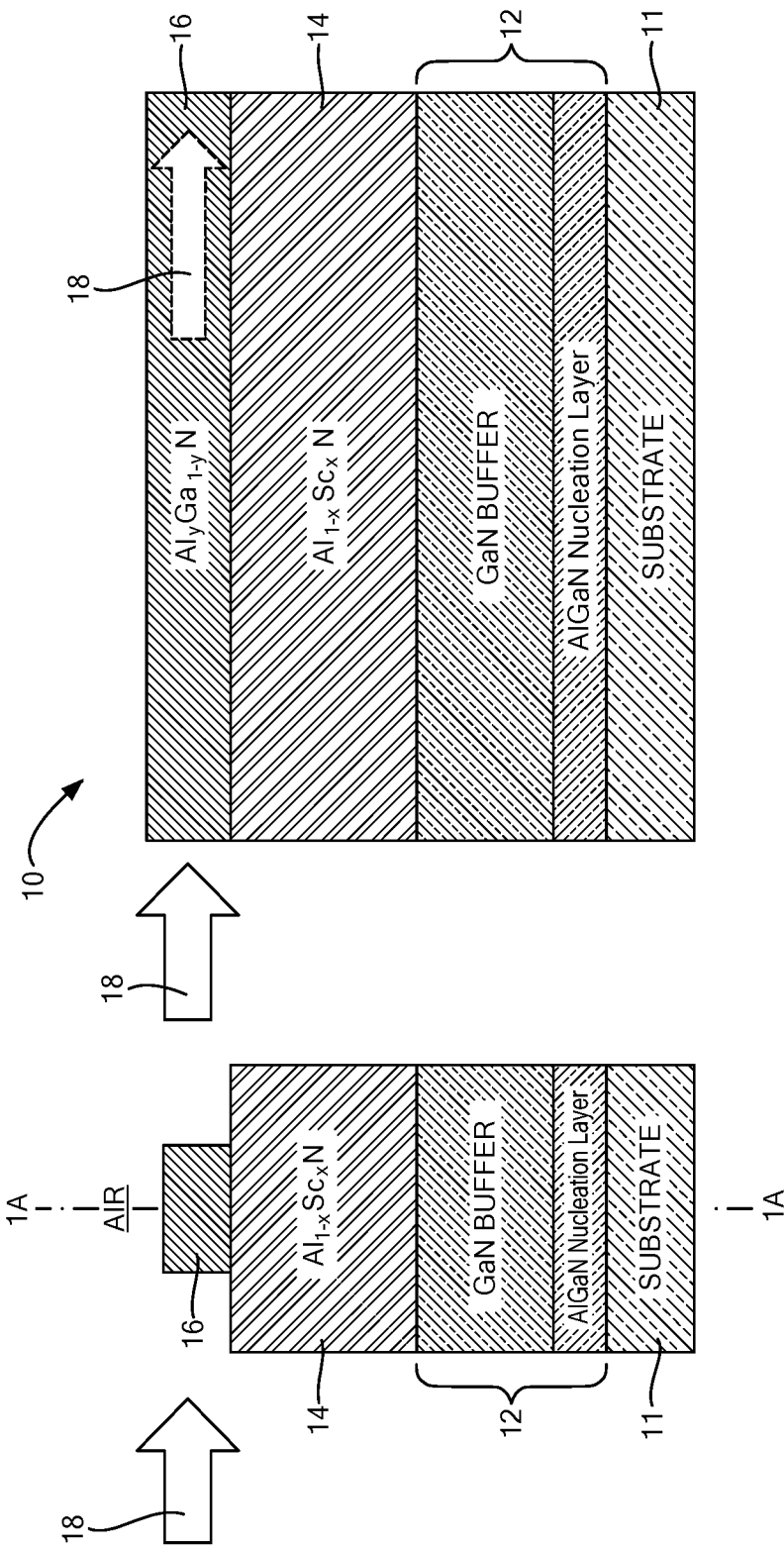
FIG. 1 is a simplified, diagrammatic sketch of a side view of the a photonic device according to the disclosure.
FIG. 1A is a simplified, diagrammatic sketch of a cross-sectional view of a photonic device of FIG. 1 according to the disclosure, such cross-section being taken along line 1A-1A in FIG. 1.

Referring now to FIGS. 1 and 1A, a photonic device 10, here a photonic waveguide, is shown having: a substrate 11, here a single crystal substrate, for example, Silicon Carbide (SiC), an AlGaN nucleation layer/GaN buffer layer 12 on the substrate 11, the AlGaN nucleation layer portion of layer 12 serves to allow the GaN buffer above it be fully relaxed. This nucleation layer/buffer layer 12 accommodates all the mismatching of III-N layers to the substrate, here for example the SiC substrate 11; a cladding layer 14, here Aluminum Scandium Nitride ($Al_{1-x}Sc_xN$), formed on an upper surface of the AlGaN nucleation layer/GaN buffer layer 12 formed in a manner to be described below; and a photonic waveguiding layer 16, here a Group III-Nitride single crystal compound, here Aluminum Gallium Nitride ($Al_yGa_{1-y}N$), formed by epitaxial growth it being noted that the values of $0<x\leq0.45$ and $0\leq y\leq1$, as will be described below, to provide lattice matching between the Aluminum Scandium Nitride ($Al_{1-x}Sc_xN$) cladding layer 14 and the Aluminum Gallium Nitride ($Al_yGa_{1-y}N$) photonic waveguiding layer 16; it being noted that the Aluminum Scandium Nitride ($Al_{1-x}Sc_xN$) cladding layer 14 and the Aluminum Gallium Nitride ($Al_yGa_{1-y}N$) photonic waveguiding layer 16 have the same wurtzite crystallographic structure and that the Aluminum Scandium Nitride ($Al_{1-x}Sc_xN$) cladding layer 14 has an index of refraction smaller than the index of refraction of the Aluminum Gallium Nitride ($Al_yGa_{1-y}N$) photonic waveguiding layer 16 at the operating wavelength of the structure; here the wavelength of the photonic waveguide being at blue-green spectrum, thereby confining laser energy, represented by arrows 18, directed to the photonic device 10 within the Aluminum Gallium Nitride ($Al_yGa_{1-y}N$) photonic waveguiding layer 16. It should be noted that AlScN has been reported in the above referenced article by M. A. Moram et al, "ScGaN and ScAlN: Emerging Nitride Materials," J. Mater. Chem. A 2, 6042 (2014) to keep its wurtzite structure (same crystalline structure as the other relevant Group III-Nitride materials) for Scandium compositions below 40-50%; however, beyond that, the AlScN changes to rocksalt; a very different crystalline structure that is incompatible with wurtzite. The refractive index of the cladding region above the photonic waveguiding layer 16 needs to be less than that of the photonic waveguiding layer 16. This cladding region above the photonic waveguiding layer 16 can be air, $SiO_2$, or silicon nitride that has a refractive index less than that of AlGaN photonic waveguiding layer 16. Here, in this example, air surrounding the top and sides of the photonic waveguiding layer 16 serves as a cladding layer.

Figure 2:
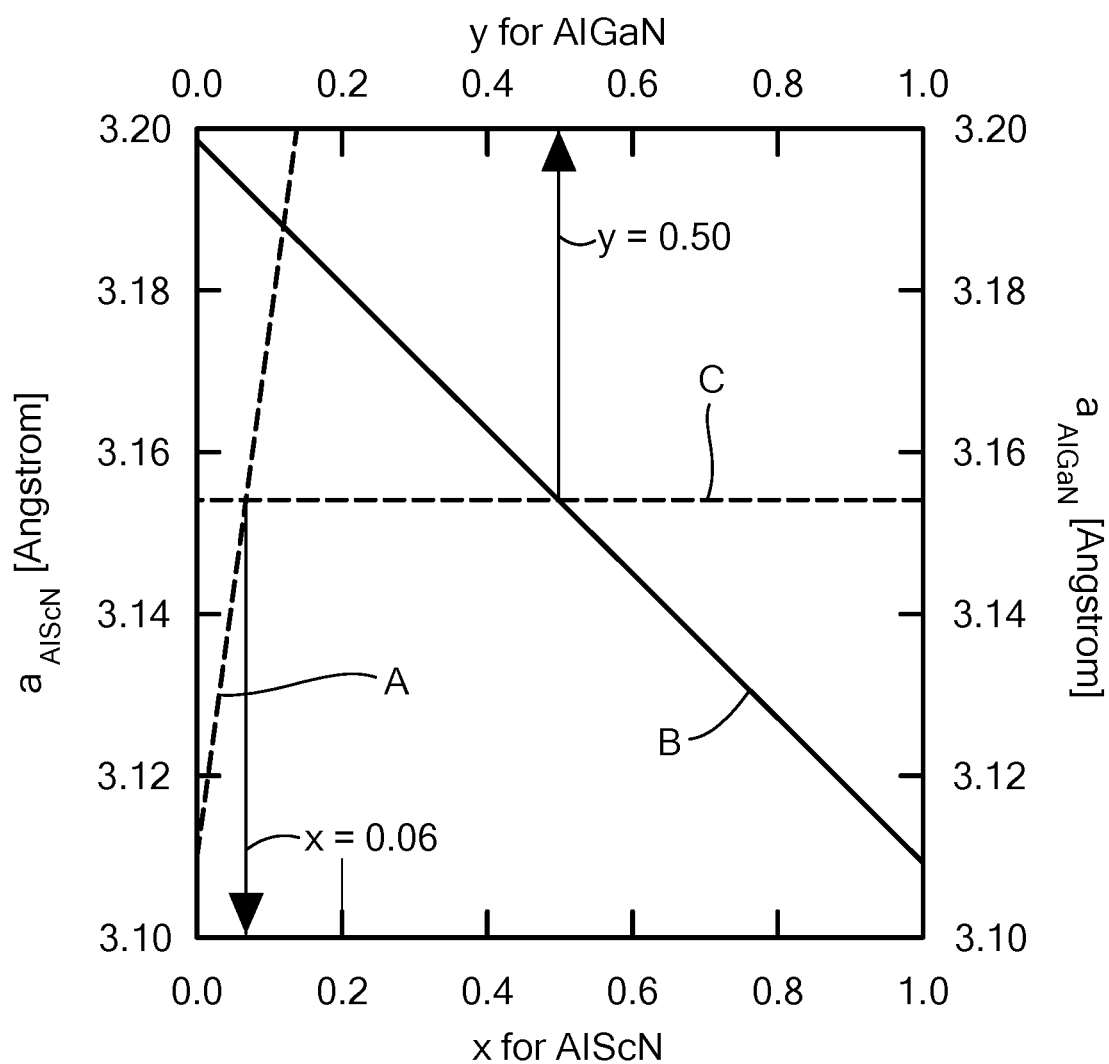
FIG. 2 is a graph showing the in-plane lattice constants, $a_{AlScN}$ as a function of x for $Al_{1-x}Sc_xN$ and $a_{AlGaN}$ as a function of y for $Al_yGa_{1-y}N$.

More particularly, referring now also to FIG. 2, the relationships between Sc mole fraction for AlScN (x) and Al mole fraction of AlGaN (y) and their in-plane lattice constants ($a_{AlScN}$ for AlScN and $a_{AlGaN}$ for AlGaN) are shown. More particularly, FIG. 2 is a graph showing the in-plane lattice constants, $a_{AlScN}$ as a function of x for $Al_{1-x}Sc_xN$ (the curve labelled A) and $a_{AlGaN}$ as a function of y for $Al_yGa_{1-y}N$ (the curve labelled B). A common range for $a_{AlScN}$ and $a_{AlGaN}$ axis is shown in the graph to illustrate the range in x and y for AlScN and AlGaN that is possible for lattice matching to occur between AlScN and AlGaN. For example, for AlScN to be lattice matched to AlGaN with the in-plane lattice constant $a_{AlGaN}$=a=3.1541 Å as shown by the horizontal dotted line labeled C, the composition of AlGaN and AlScN are respectively y=0.50, x=0.06.

The table below shows some example values for x and y that result in perfect lattice matching for these two materials based on FIG. 2:

TABLE

| x for $Al_{1-x}Sc_xN$ | y for $Al_yGa_{1-y}N$ |
| --- | --- |
| 0.00 | 0.90 |
| 0.05 | 0.47 |
| 0.06 | 0.50 |
| 0.10 | 0.04 |

The lattice constant expressions for these two materials are $a_{AlScN}$=3.111+0.744x, (see R. Deng, S. R. Evans, and D. Gall, "Bandgap in $Al_{1-x}Sc_xN$," App. Phys. Lett. 102, 112103 (2013)) for AlScN and $a_{AlGaN}$=3.189-0.086y, (see H. Morkoc, *Handbook of Nitride Semiconductors and Devices, Vol. 1: Material Properties, Physics and Growth*, Wiley-VCH, Germany 2008). Thus, with proper selection of x and y, the photonic waveguiding layer $Al_yGa_{1-y}N$ layer 16 of the photonic device 10 is lattice matched to the underneath cladding $Al_{1-x}Sc_xN$ layer 14.

Referring now to FIGS. 3A and 3B, a photonic device, here a photonic waveguide, 10' is shown. Here, y=0, a GaN photonic waveguiding layer 16 is lattice matched to $Al_{0.89}Sc_{0.11}$ cladding layer 14. Since there are no $Al_{0.89}Sc_{0.11}N$ substrates presently commercially available, here, in this example, the AlGaN nucleation layer/GaN buffer layer is grown on a substrate 11 such as SiC or sapphire having a thickness of approximately 2 micrometers, as shown in FIG. 3A. Thus, here the AlGaN nucleation layer/GaN buffer layer 12 also serves as the buffer layer as described above in connection with FIG. 1. Starting from the AlGaN nucleation layer/GaN buffer layer, 12 a cladding layer 14 of $Al_{0.89}Sc_{0.11}N$, having a thickness of approximately 1-2 micrometers, is first epitaxially grown on top or upper surface of the AlGaN nucleation layer/GaN buffer layer 12. Then the GaN photonic waveguiding layer 16 is grown epitaxially with the required thickness (e.g. approximately 100-500 nm) for the photonic device 10' for visible to near infrared wavelengths. Conventional lithography and etching can produce the photonic device 10'. FIG. 3B shows a simulated optical mode of such photonic waveguide structure shown in FIG. 3A, and for an example photonic device with dimensions of 700 nm×350 nm. Here, the air surrounding the top and sides of the photonic waveguiding layer 16 serves as cladding; it being noted that air has a lower index of refraction than the index of refraction of the photonic waveguiding layer 16. The refractive index difference between the GaN and the $Al_{0.89}Sc_{0.11}N$ is ~0.2 at the operating wavelength, here 500 nm, and so a strong optical energy propagation mode control or confinement can be achieved within photonic waveguiding layer 16 for a photonic waveguide with nominal dimensions (e.g. width of 700 nm and height of 350 nm) considered for the simulation in FIG. 3B.

Figure 4:
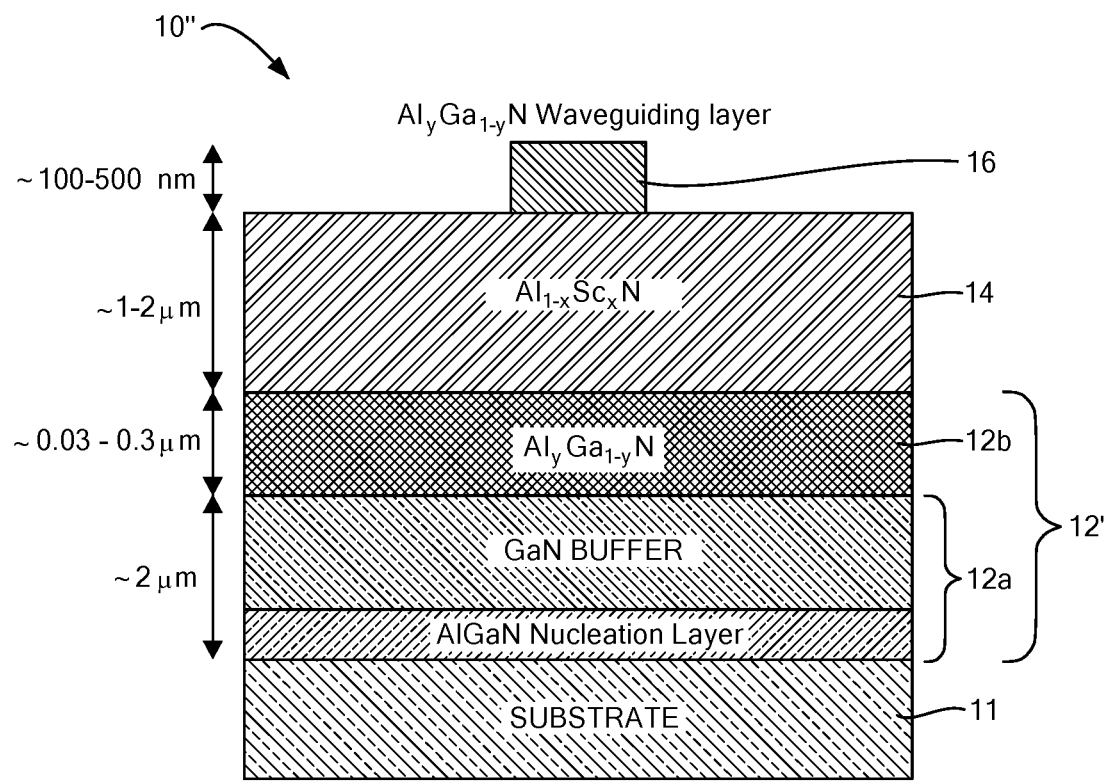
FIG. 4 is a diagrammatical, a cross sectional sketch of a photonic device having an $Al_yGa_{1-y}N$ waveguiding layer with $y=0$ lattice matched to an $Al_{0.89}Sc_{0.11}N$ underneath cladding layer disposed on a $Al_yGa_{1-y}N$/GaN buffer layer that is epitaxially grown on SiC, Sapphire or Si substrates having an AlGaN nucleation layer according to the disclosure.

FIG. 4 shows a more general case of an embodiment of a photonic waveguide device structure 10" having an $Al_yGa_{1-y}N$ photonic waveguiding layer 16, here having a thickness of approximately 100-500 nm for visible to near infrared, on an $Al_{1-x}Sc_xN$ cladding layer 14. Here again, as in FIG. 3, an AlGaN/GaN buffer layer 12' is formed on substrate 11. Here, however, the buffer layer 12' has a lower layer 12a, the AlGaN nucleation layer/GaN buffer layer (with a thickness usually larger than 1 micron) and an upper thin layer 12b of $Al_yGa_{1-y}N$ epitaxially formed on the AlGaN nucleation layer/GaN buffer layer 12a, as shown. An $Al_{1-x}Sc_xN$ cladding layer 14 is formed epitaxially on the $Al_yGa_{1-y}N$ and AlGaN nucleation layer/GaN buffer layer 12'. The purpose of that upper $Al_yGa_{1-y}N$ layer 12b is to provide a better lattice matching to the $Al_{1-x}Sc_xN$ cladding layer 14 and thereby reduce the strain in the structure that can lead to generating dislocations in the $Al_{1-x}Sc_xN$ cladding layer 14. Only when x=0.11 for layer 14, is the upper $Al_yGa_{1-y}N$ layer 12b not needed as the $Al_{0.89}Sc_{0.11}N$ cladding layer 14 can be grown lattice-matched to the AlGaN nucleation layer/GaN buffer layer 12a as shown in FIG. 2. Moreover, the $Al_yGa_{1-y}N$ layer 12b can be graded in Al composition from y=0 (which is GaN) at the bottom portion of layer 12b in contact with GaN buffer portion of layer 12a to some composition y>0 at the top of layer 12b that is lattice matched to the $Al_{1-x}Sc_xN$ cladding layer 14. The cross section of photonic waveguide device 10" having an $Al_yGa_{1-y}N$ photonic waveguiding layer 16 in FIG. 4 which can be lattice matched to $Al_{1-x}Sc_xN$ underneath. The process starts with an AlGaN nucleation layer/GaN buffer layer 12a on SiC or Sapphire substrate 11. As noted above, first a thin $Al_yGa_{1-y}N$ layer 12b is grown on the AlGaN nucleation layer/GaN buffer layer 12a. Then the $Al_{1-x}Sc_xN$ cladding layer 14 which is lattice matched to $Al_yGa_{1-y}N$ layer 12b is grown. Finally the top photonic waveguiding layer $Al_yGa_{1-y}N$ layer 16 is grown on the $Al_{1-x}Sc_xN$ layer 14. Lithography and etching is used to define the cross section of the $Al_yGa_{1-y}N$ photonic waveguiding layer, as shown in FIG. 4.

It is noted that if the waveguiding layer was $Al_yGa_{1-y}N$, where y is not equal to 0, then the cladding layer 14 needs to be $Al_{1-x}Sc_xN$, with x being different than 0.89 (see TABLE above for different values of y and their corresponding x values) so that these two layers are lattice-matched to each other.

Figure 5:
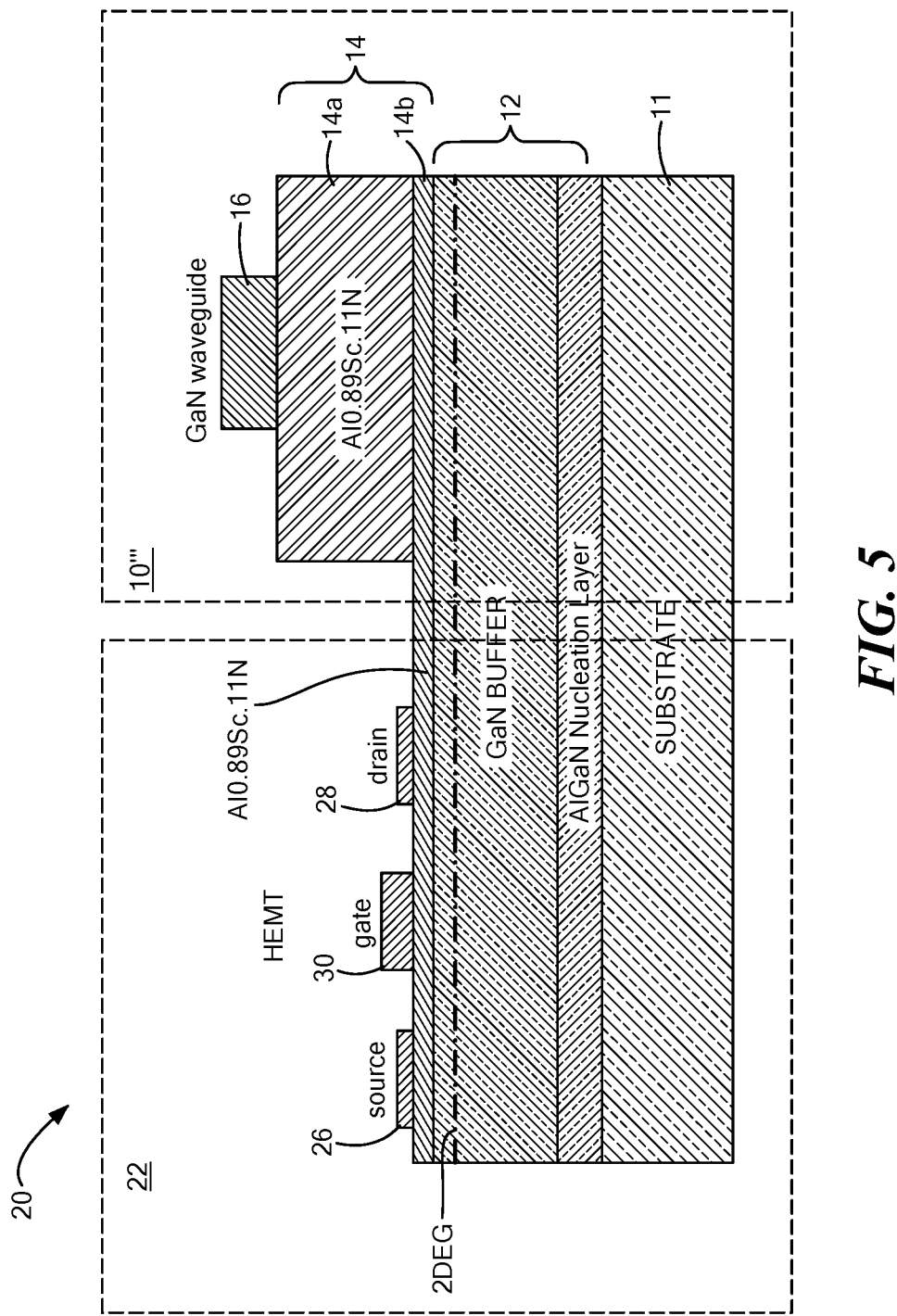
FIG. 5 is a simplified, diagrammatical, cross sectional sketch of a structure having a photonic device having a GaN photonic waveguiding layer on an $Al_{0.89}S_{0.11}N$ underneath cladding layer and integrated with a HEMT transistor that uses the same $Al_{0.89}Sc_{0.11}N$ according to the disclosure.

FIG. 5 is a structure 20 having a photonic device 10''' integrated on a common crystal substrate 11 with a HEMT transistor 22. More particularly, the photonic device 10''' includes a GaN photonic waveguiding layer 16 on an $Al_{0.89}Sc_{0.11}N$ underneath cladding layer 14a and the HEMT transistor 22 includes source, drain, and gate electrodes 26, 28 and 30, respectively, such photonic device 10''' and HEMT transistor 22 using the same $Al_{0.89}Sc_{0.11}N$ layer 14b.

Figure 5A:
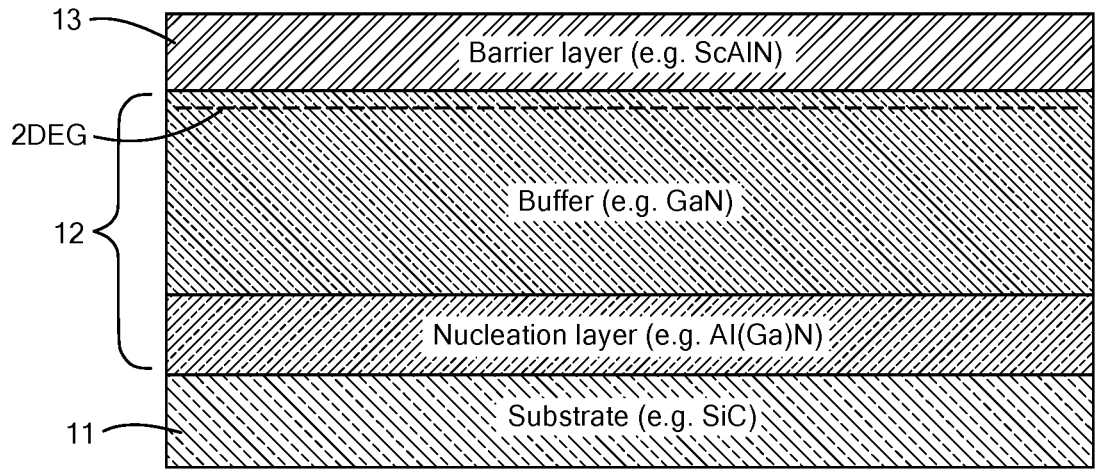
FIGS. 5A-5J are simplified, diagrammatical, cross sectional sketches showing a process used to form a photonic device having a GaN photonic waveguiding layer on an AlScN underneath cladding layer and integrated with a HEMT transistor according to an alternate embodiment.

Referring now to FIGS. 5A through 5J, one method is described for forming a structure 20' having photonic device 10'''' (FIG. 5J), such photonic device 10'''' having a GaN photonic waveguiding layer 16 on an $Al_{0.89}Sc_{0.11}N$ underneath cladding layer 14a and an HEMT transistor 22' electrically connected to the photonic device 10'''', here the photonic device 10'''' and the HEMT transistor 22' use the same $Al_{0.89}Sc_{0.11}N$ layer 14b. Thus, the nucleation layer/buffer layer structure 12 is formed on the substrate 11, as shown, followed by a barrier layer portion 14b, here ScAlN, using molecular beam epitaxy (MBE); it being noted that a heterojunction between the ScAlN barrier layer portion 14b and GaN buffer layer 12 produces a Two-Dimensional Electron Gas (2DEG) in the GaN buffer layer 12 indicated by the dotted line, as shown in FIG. 5A.

Figure 5B:
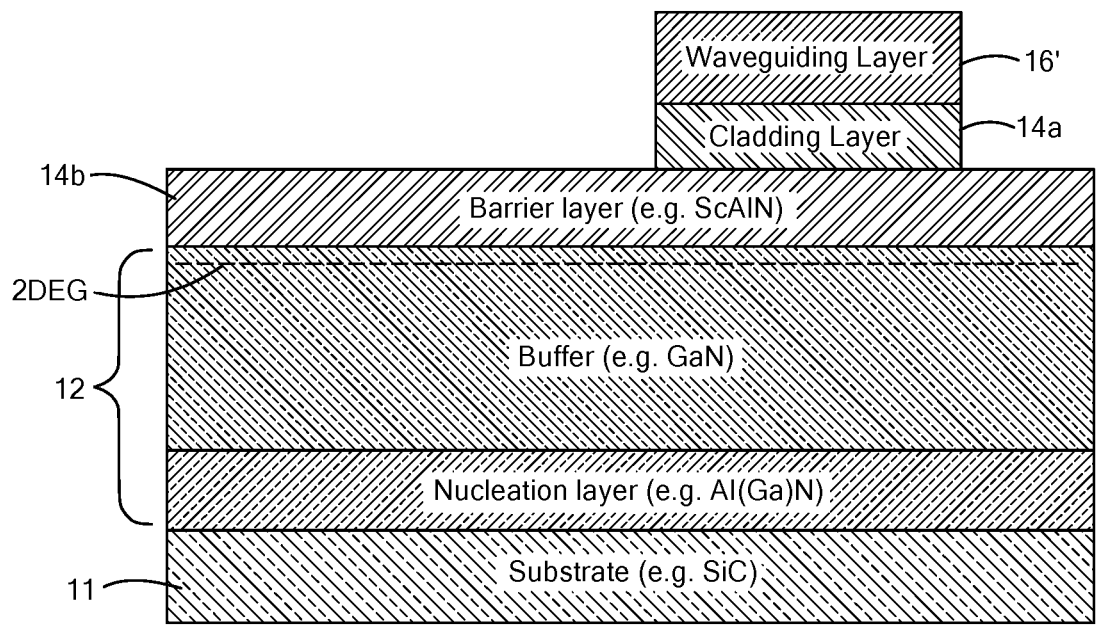
Figure 5C:
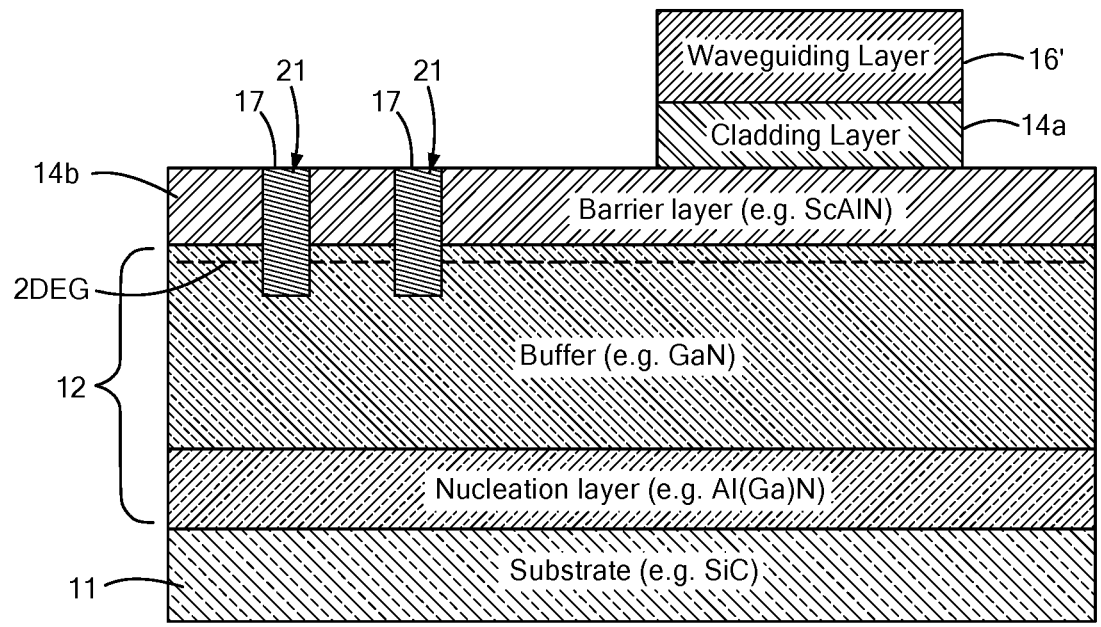
Figure 5D:
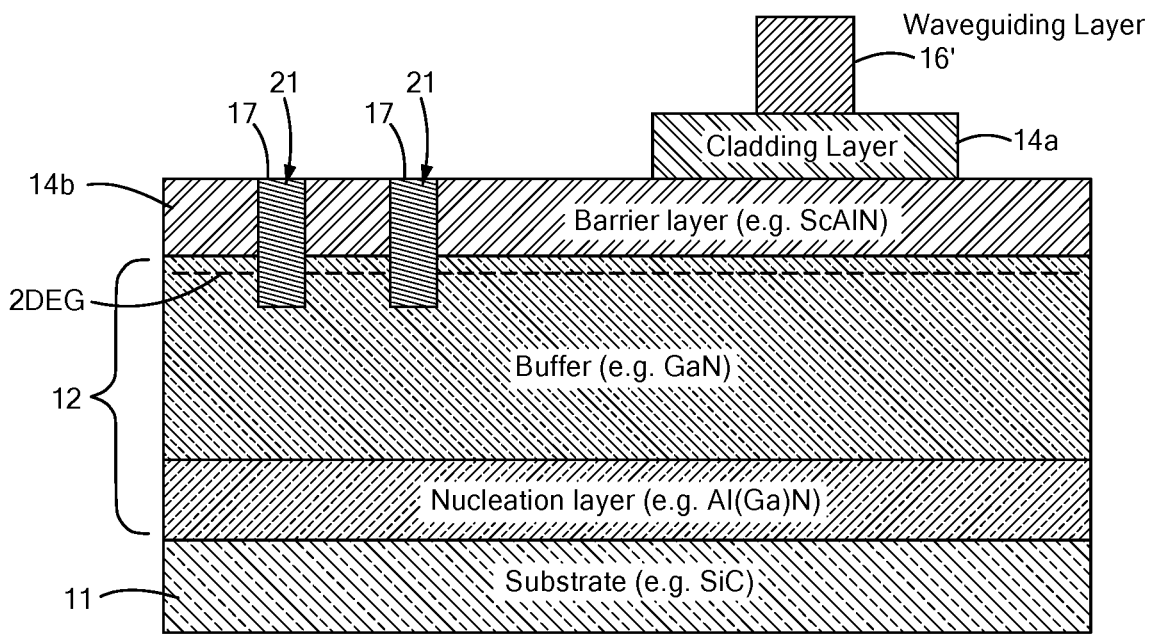

Next, referring to FIG. 5B, a photonic device integration regrowth process is performed: A Plasma Enhanced Chemical Vapor Deposition (PECVD) or Atomic Layer Deposition (ALD) process or related technique is used to form a dielectric etch mask (e.g. $SiN_x$); not shown; the mask being patterned to define windows via optical lithography in a selected region to expose the portions of the surface of layer 14 for where the photonic device will be formed (here the right side portion of the structures shown in FIG. 5A); an epitaxial regrowth is performed, here by Molecular Beam Epitaxy, (MBE) to form cladding layer 14a (e.g., ScAlN) and waveguiding layer 16, here GaN, as shown in FIG. 5C. The mask described above is then removed leaving the structure shown in FIG. 5B.

Next, and referring to FIG. 5C, a process is used to define the ohmic contacts for the HEMT: Using conventional lithography and etching techniques, selected portions of the barrier layer 14b and into the upper portion of the GaN buffer layer 12 are etched for source/drain region forming a recess 21 in the barrier layer portion 14b and into the upper portion of the GaN buffer layer 12, as shown. This process is sometimes referred to as an ohmic regrowth process, see J. Guo et al, "MBE-Regrown Ohmics in InAlN HEMTs With a Regrowth Interface Resistance of 0.05 Ω·mm", IEEE Electron Dev. Lett., vol. 33(04), pp. 525, 2012. This is the process that allows us to form low ohmic contact resistance on materials such as ScAlN/GaN where the barrier bandgap is too large to allow the conventional ohmic process that involves direct metal deposition and liftoff of Ti/Al, Mo/Al, Ta/Al and related multilayer metal structures for electrodes on the barrier followed by high temperature anneal (e.g. $T_{anneal}$>600° C.) to produce low ohmic contact resistance. In this process a dielectric etch mask (e.g. $SiN_x$), not shown, is deposited on top of the barrier layer portion 14b. Using photoresist, regions for the source and drain are patterned where the $SiN_x$ is first etched with a Flourine-based etchant followed by a Chlorine-based etchant to etch the barrier layer 14 and an upper portion of the GaN buffer layer 12. Once this etch is complete, the wafer goes back into an MBE or MOCVD and a thin layer of $n^{++}$-GaN regions 17 are grown over the whole wafer which will be directly on top of the $SiN_x$ etch mask with the exception of the etched regions where the $n^{++}$-GaN will fill it and contact the 2DEG on the side. Once the re-growth is completed, a combination of dry and wet etching is done to remove (lift-off) the dielectric etch mask and the re-growth $n^{++}$-GaN above it which turns out to be polycrystalline leaving behind the $n^{++}$-GaN crystalline regrowth region 17 in the source and drain region, as shown in FIG. 5C.

Next, the Photonic Device is defined: The structure shown in FIG. 5C is coated with photoresist, not shown; the photoresist is patterned to define regions for the waveguiding layer 16' of the photonic device is to be formed, via optical lithography; the exposed portions of the waveguide layer 16' are removed with here, in this example, a chlorine ($Cl_2$) based plasma etchant; then the mask (photoresist) is removed leaving the structure shown in FIG. 5D.

Figure 5E:
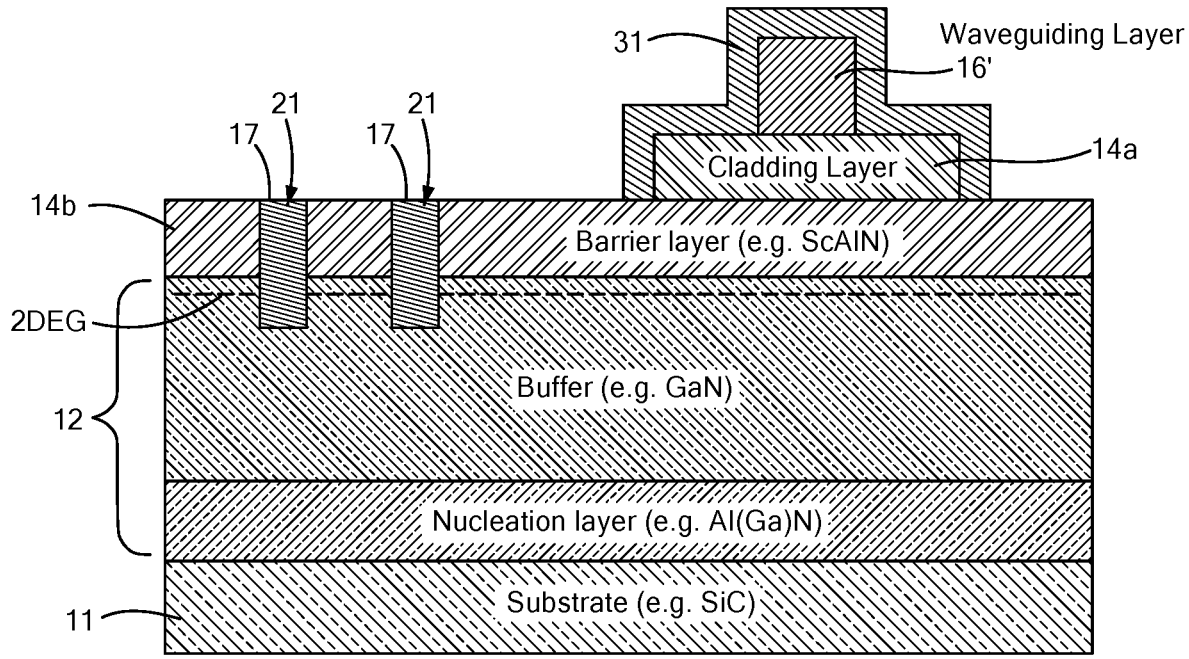

Next, a process is used to form the top cladding layer of the photonic device: A layer of cladding material, here for example $SiO_2$ is deposited over the structure shown in FIG. 5D using, for example, PECVD, ALD or related technique; the deposited layer is patterned with photoresist, not shown, to define regions to remove top cladding layer in areas not needed leaving, after removal of the photoresist layer, the cladding layer 31 as shown in FIG. 5E.

Figure 5F:
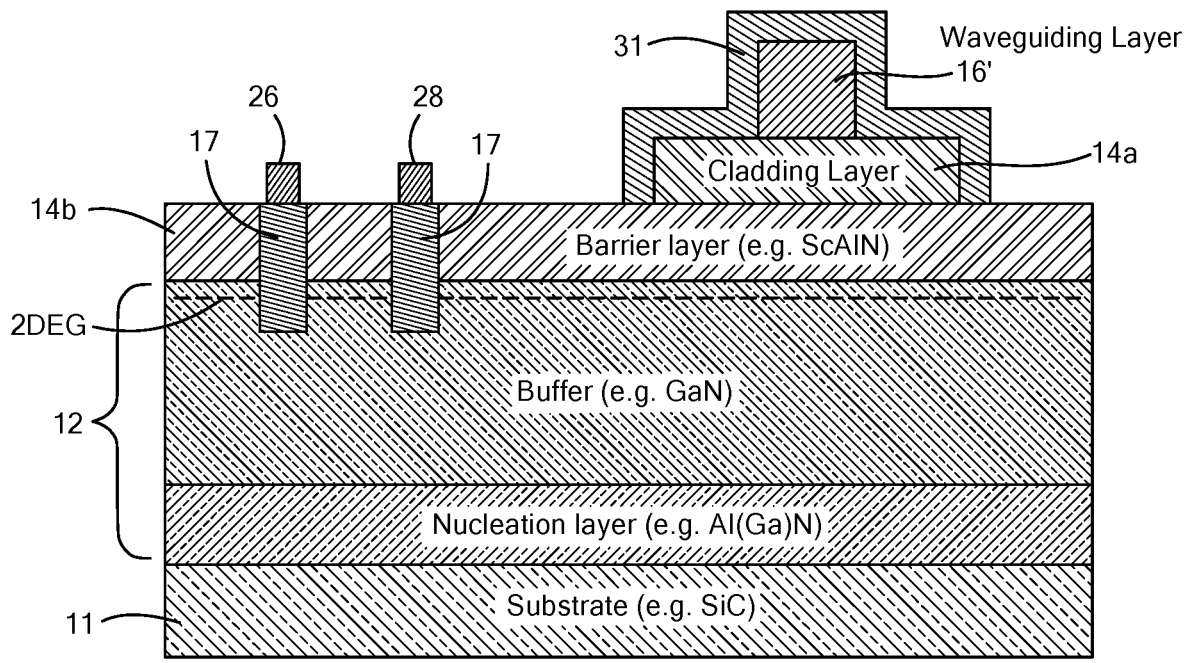

Next, a process is used to form the HEMT source/drain ohmic contacts: More particularly, and referring to FIG. 5F, the metal source electrode 26 and drain electrode 28 are then formed in ohmic contact with the re-growth $n^{++}$-GaN regions 17 (FIG. 5F).

Figure 5G:
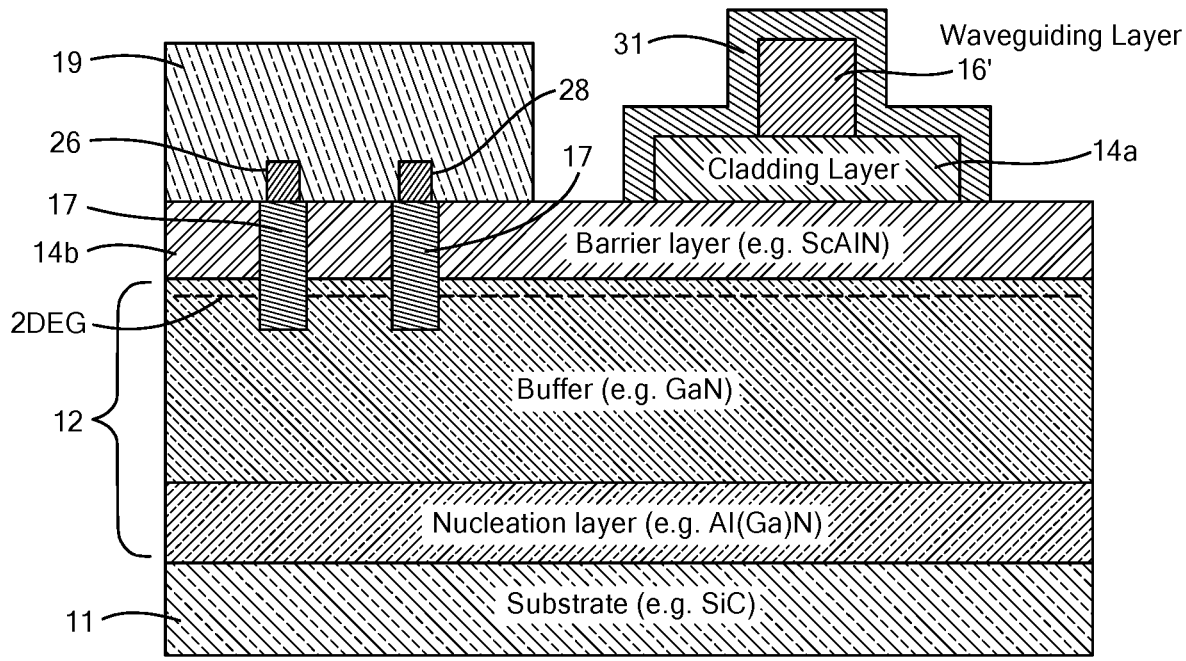

Next, a surface passivation is provided for the HEMT: Referring to FIG. 5G, a layer 19 of surface passivation dielectric (e.g. $SiN_x$) is deposited, here for example, deposited via PECVD, ALD or related technique over structure shown in FIG. 5F; Patterning window in the passivation layer 19 with photoresist to define regions to remove surface passivation not needed; Etching away unneeded passivation dielectric passivation layer 19; and the remove photoresist resting in the structure shown in FIG. 5G.

Figure 5H:
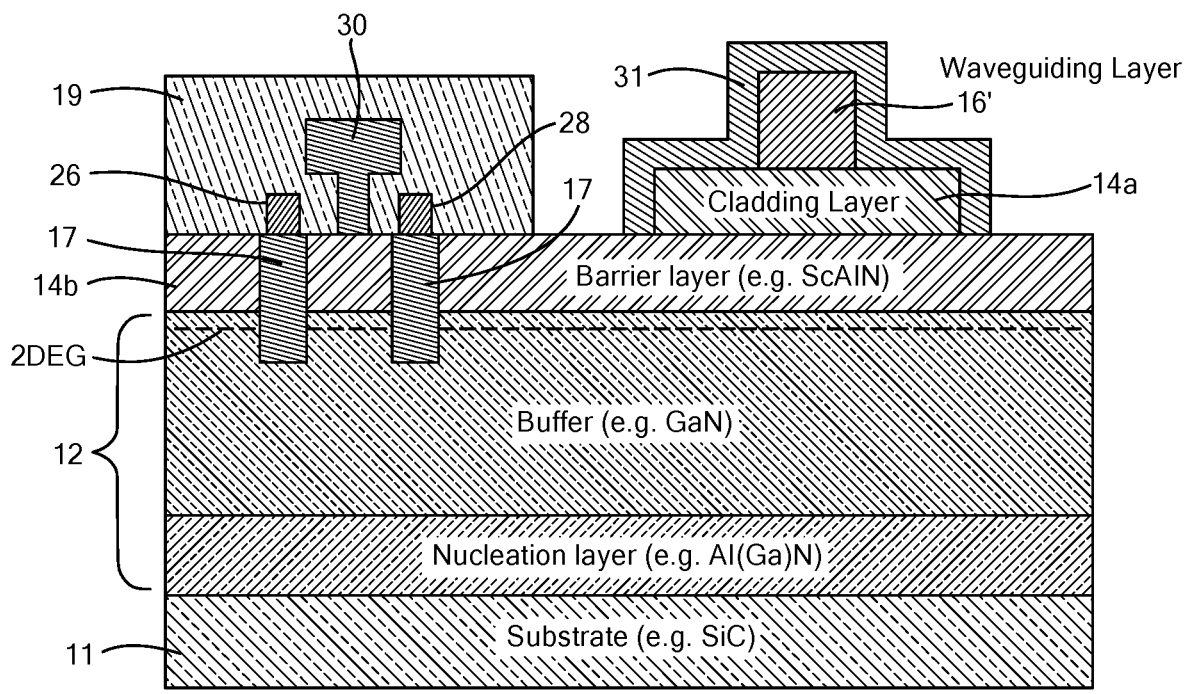

Next, a process is used to form the gate electrode of the HEMT: Referring to FIG. 5H a photoresist, not shown, is used to define windows through surface passivation dielectric 19 for the gate electrode; the exposed portions of the dielectric passivation layer 19 are etched away to expose the selected portion of the surface of barrier layer 14b to make contact with, here for example, Schottky contact with, the gate metal; the gate metal is then deposited over the photoresist and through the window onto the exposed selected portion of the surface of barrier layer 14b to make contact with the surface of barrier layer 14b; the photoresist is then lifted off with the gate metal deposited therein removed leaving the gate electrode 30, as shown in FIG. 5H.

More particularly, in this example, the gate electrode 30 is formed by lithographically patterning an e-beam resist mask, not shown, such as for example, polymethyl methacrylate (PMMA) or similar variants between the source and drain $n^{++}$-GaN regions 17. It should be understood that here, in this example, the gate electrode 30 is a sub-micron gate; however one could also form the gate 30 with optical lithography for larger sized gates.

As mentioned briefly above, the mask, not shown, has a window over the gate region. A metal is deposited over the mask, the mask is lifted off to remove the gate metal on the mask leaving the gate electrode 30. Subsequently, an additional passivation layer 19', here for example, $SiN_x$, is deposited over the surface of the structure as shown in FIG. 5H using, for example, PECVD, or an alternate technique.

Figure 5I:
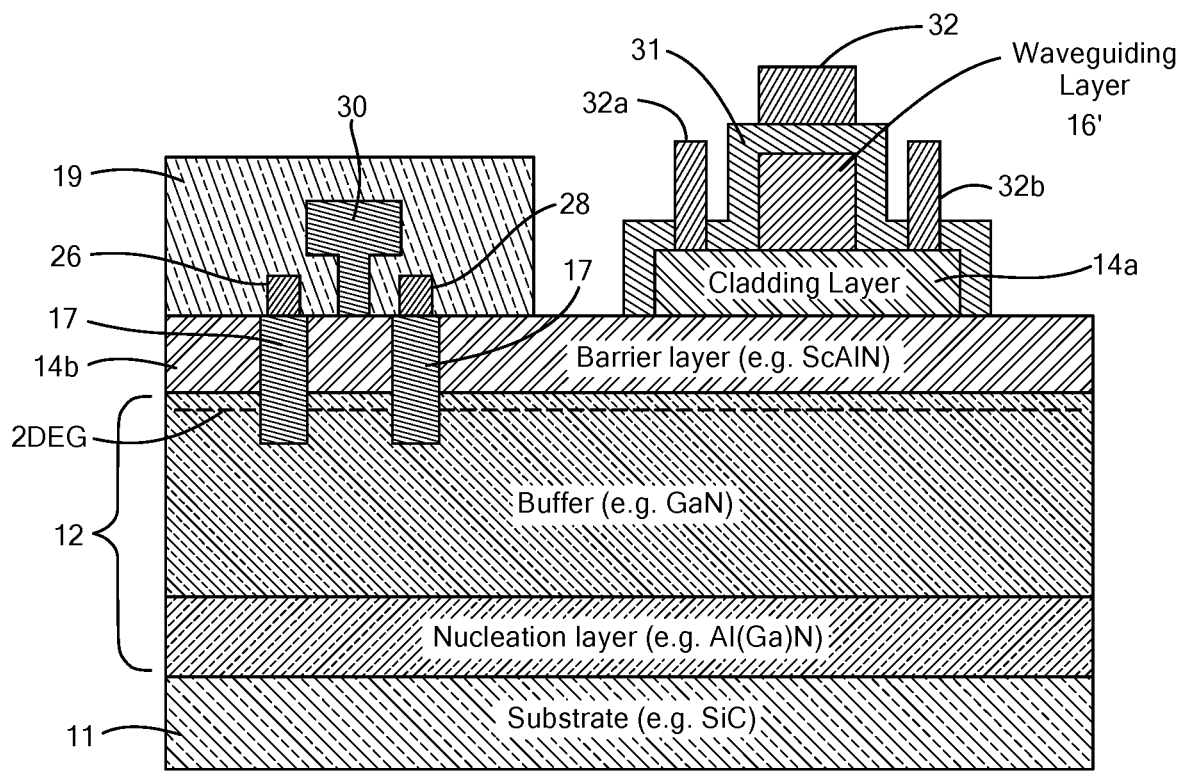

Next, a process is used to form the electrodes for the photonic device: Referring to FIG. 5I, a photoresist layer, not shown, is patterned using optical lithography to define selected regions on the cladding layer 31 where the electrodes for the photonic device are to be formed; a layer of metal is deposited over the photoresist resist and onto the selected regions on the cladding layer 31 and on the barrier layer 14b where the electrodes for the photonic device are to be formed; the photoresist layer is then lifted off along with the portions of the material thereon leaving the electrodes 32, 32a and 32b, producing the structure shown in FIG. 5I.

Figure 5J:
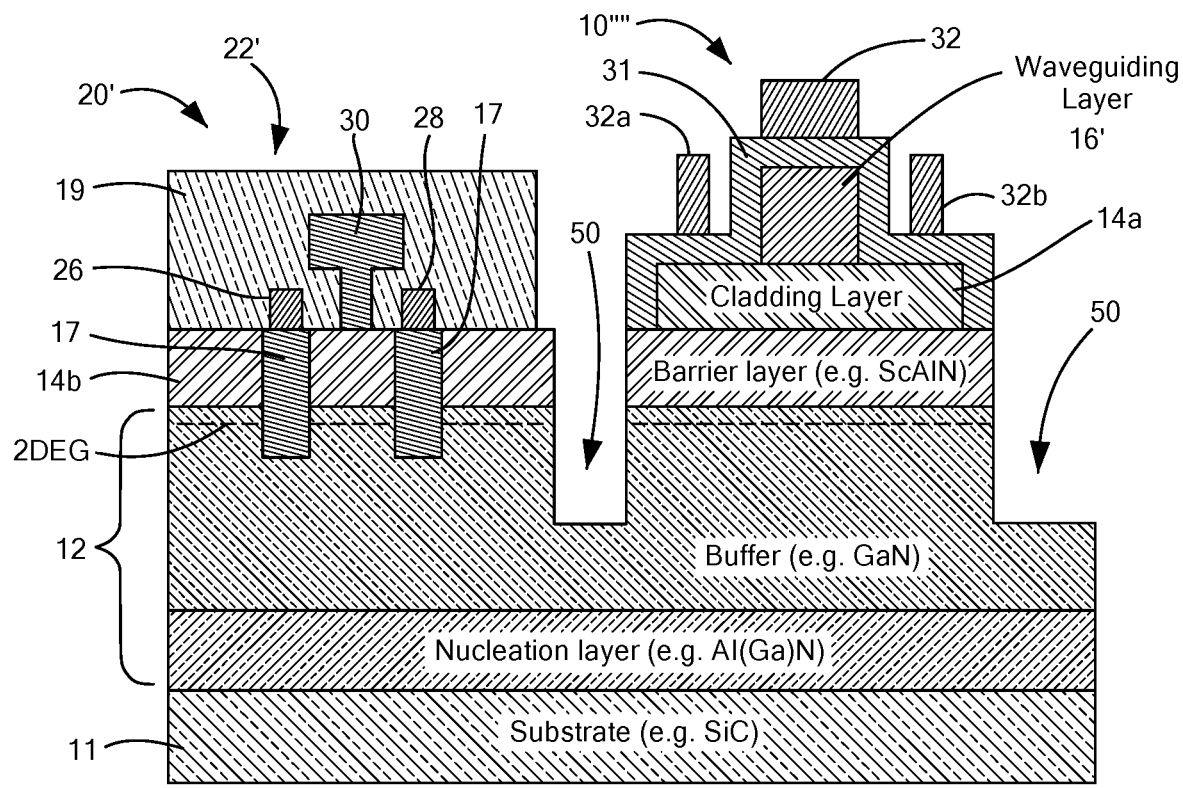
Figure 5J:
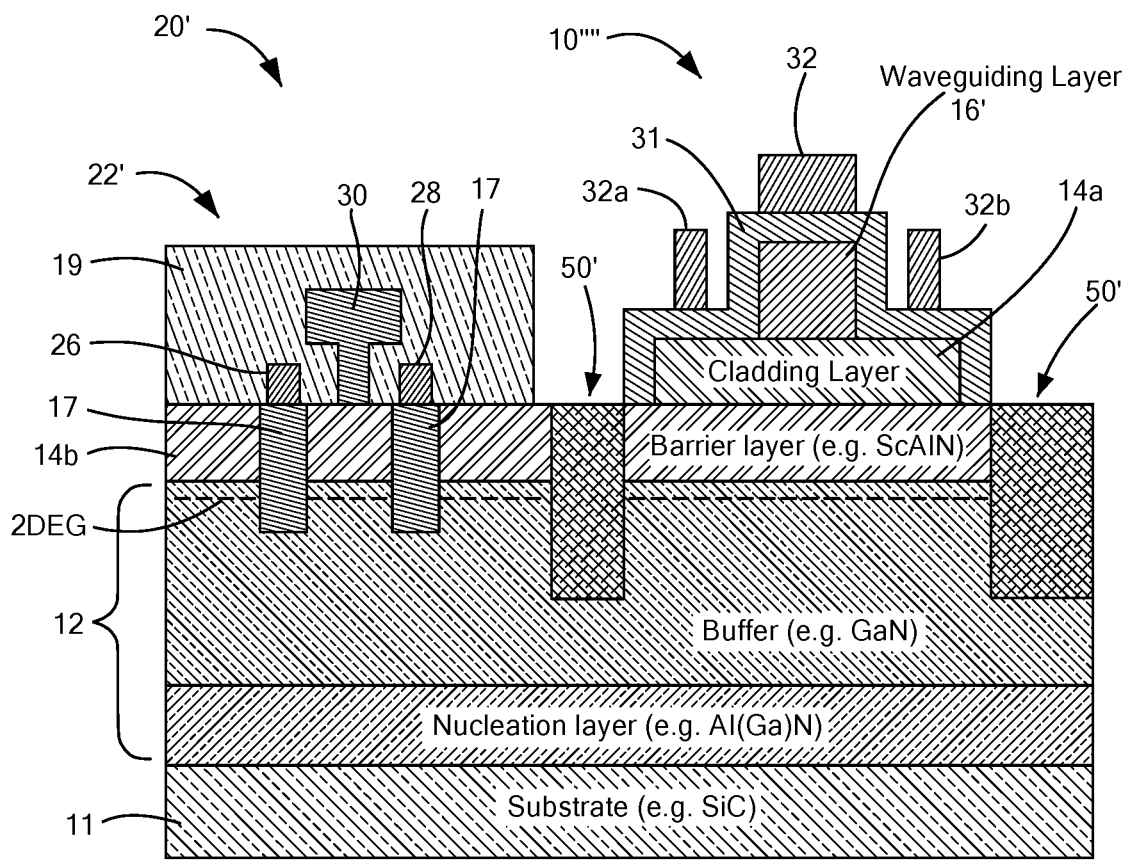

Next, a process is used to separate the HEMT and photonic device: Thus, referring to FIG. 5J, here the HEMT 22' and photonic device 10''' are separated by a trench 50 into the top portion of the buffer layer 12, as shown to form a pair of mesa structures using optical resist techniques and either etching, as shown in FIG. 5J or using ion implantation into region 50; as shown in FIG. 5J'. It should be understood that the separation process may be performed starting with the structure shown in FIG. 5A.

An alternate method where layers 14a and 14b in FIGS. 5A-5J and 5J', are epitaxially grown to support the photonic device fabrication first and then subsequently through conventional lithography and etching remove 14a in the HEMT portion of the device to define 14b for the HEMT 22 is not desired. This is because the resulting etched surface of 14b can lead to carrier trapping in the HEMT which impacts overall RF performance and reliability. As III-Nitride materials are polar materials, the 2DEG that is formed in the HEMT through polarization is highly surface sensitive. Therefore, it is preferable to build the integrated device of FIG. 5 as described in FIGS. 5A-5G starting with thinner barrier 14b followed by growth of 14a only for the photonic device.

Figure 6:
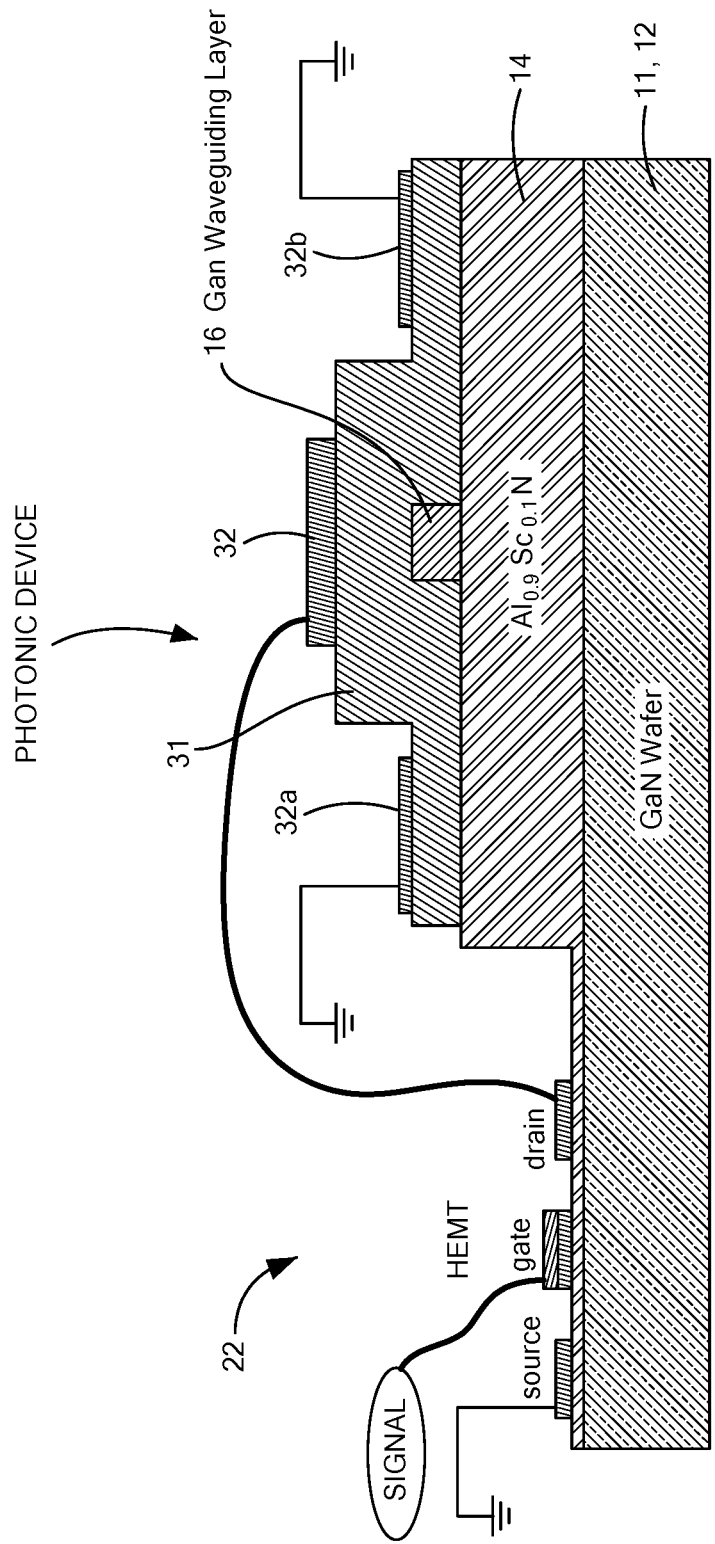
FIG. 6 is a simplified, diagrammatical cross sectional sketch of a photonic device having a having a GaN photonic waveguiding layer on an $Al_{0.89}Sc_{0.11}N$ underneath cladding layer and integrated with a HEMT transistor that uses the same $Al_{0.89}Sc_{0.11}N$ as shown in FIG. 5 showing schematically electrical connections between the photonic device and the HEMT according to the disclosure.

FIG. 6 is a simplified, cross sectional sketch of a structure having GaN photonic waveguiding layer on an $Al_{0.89}Sc_{0.11}N$ underneath cladding layer and integrated with, and electrically connected to a HEMT transistor that uses the same $Al_{0.89}Sc_{0.11}N$ according to another embodiment of the disclosure. Here, the photonic waveguiding layer 16 is GaN (i.e. $Al_yGa_{1-y}N$ with y=0) can be electro-optically tuned by applying voltage from the HEMT. The GaN waveguide layer 16 is covered with a top cladding layer 31 material (e.g. $SiO_2$) and integrated with metal electrodes 32, 32a, and 32b to induce electro-optic effects in the GaN waveguiding layer 16. The top cladding layer 31 isolates optically the GaN waveguide layer 16 from the metal electrodes 32, 32a, and 32b to avoid metal loss on the GaN waveguiding layer 16. The electrodes 32a, 32b on the left and the right of the GaN waveguiding layer be connected to electric ground, not shown, while the middle electrode 32 on top of the GaN waveguiding layer 16, more particularly on the top portion of the cladding layer 31, can be electrically connected to the HEMT 22 transistor to serve as a source for the photonic device. Thus, a voltage at the electrode 32 produces an electric field that passes between the electrode 32 and grounded electrodes 32a, 32b, such electric field passing through the waveguiding layer.

Figure 7:
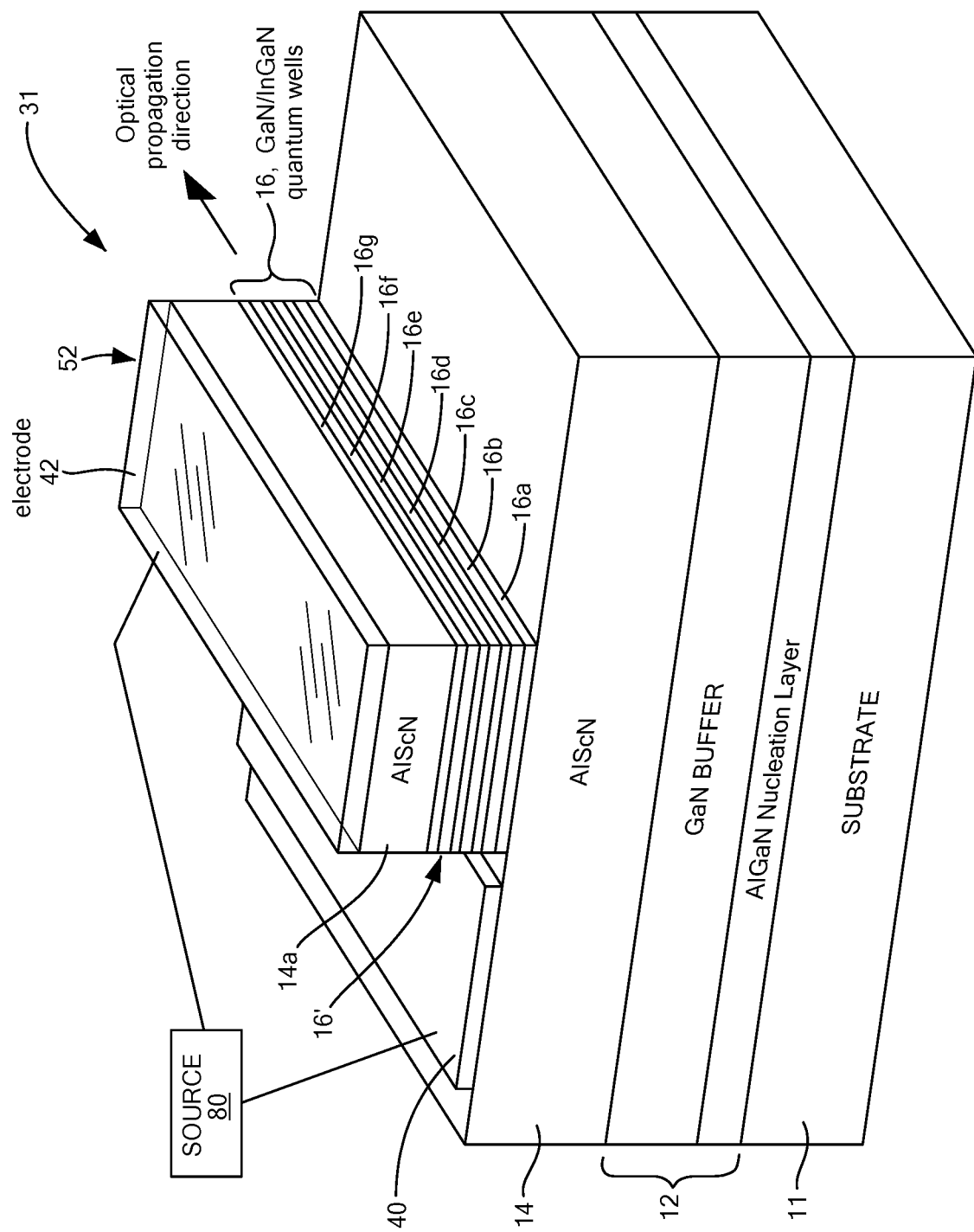
FIG. 7 is a simplified, diagrammatical isometric sketch of a photonic device adapted for use with an in-plane modulator or in-plane laser according to one embodiment of the disclosure.

Referring now to FIG. 7 a photonic device, here a photonic device 31 is shown adapted to provide as an in-plane modulator. It is noted that the photonic device 31 may be used in a laser; it being noted that an in-plane modulator and laser that have similar generic structures. By starting from substrate 11, the AlGaN nucleation layer/GaN buffer layer 12 is formed as described in connection with FIG. 4, a cladding layer 14 of AlScN is first epitaxially grown on top of the AlGaN nucleation layer/GaN buffer layer 12. Here the photonic waveguiding layer 16' comprises a stack of multiple quantum well layers comprising of GaN and $In_zGa_{1-z}N$ layers where $0<z\leq1$ layers formed on the cladding layer 14. More particularly, the quantum well photonic waveguiding layer 16' includes alternating layers 16a, 16b, 16c, 16d, 16e, 16f and 16g of GaN and InGaN to provide the photonic waveguiding layer 16' of the photonic waveguide device 31; it being understood that the number of layers may be different from that shown. More particularly, a bottom layer 16a of GaN on the AlScN layer 14, next layer 16b of InGaN, next layer 16c of GaN, next layer 16d of InGaN, next layer 16e of GaN, next layer 16f of InGaN, and next top layer 16g of GaN. A second AlScN cladding layer 14a is formed on the top of the quantum well photonic waveguiding layer 16', as shown. A pair of electrodes 40, 42 is formed on the AlScN layer 14 and the AlScN layer 14a, respectively, as shown. These electrodes 40, 42 may be used receive a voltage from source 80 (FIG. 7) to pump the photonic waveguiding layer 16' and thereby generate photons within the photonic waveguiding layer 16' as when used as a laser or the voltage may be used to pump the waveguiding layer 16' and by modulating the control signal from the source 80 modulate photons generated in the photonic waveguiding layer 16' and then propagate the generated photons through the waveguiding layer 16'. Here, photons propagate along a direction parallel to the layers 16a-16g, it being noted that here, only two periodic stacks of quantum well layer sections are shown for simplicity, of the GaN/InGaN multiple quantum well stack and such photon propagation mode control or confinement is performed by the cladding layers 14 and 14a in the pillar-like structure 52, as shown.

Figure 8:
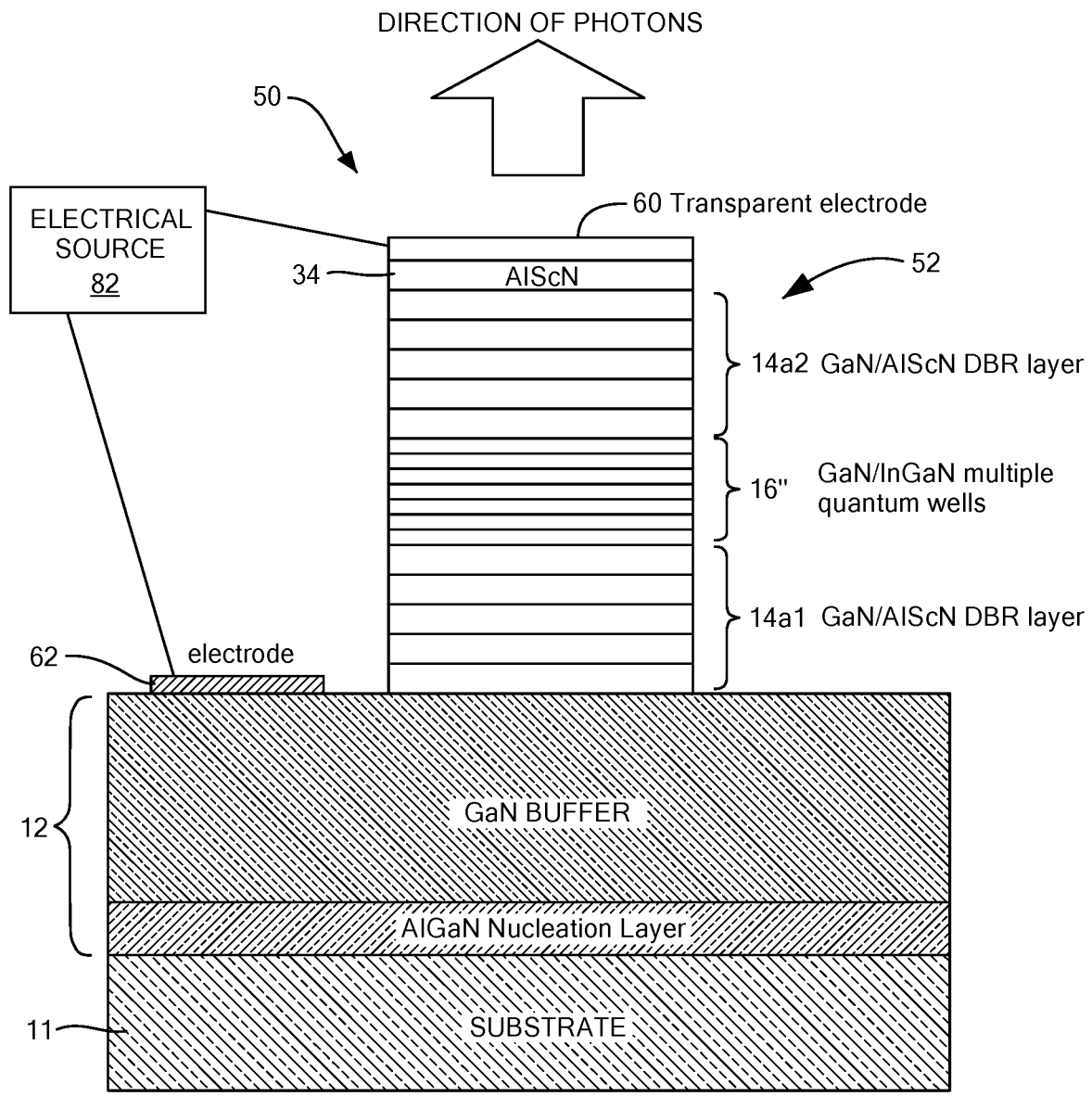
FIG. 8 is a simplified, diagrammatical, cross-sectional sketch of a photonic device adapted for use with an out-of-plane modulator or laser according to another embodiment of the disclosure, such sketch showing a pair DBRs and a multiple quantum wells sandwiched between the pair of DBRs.
Figure 8A:
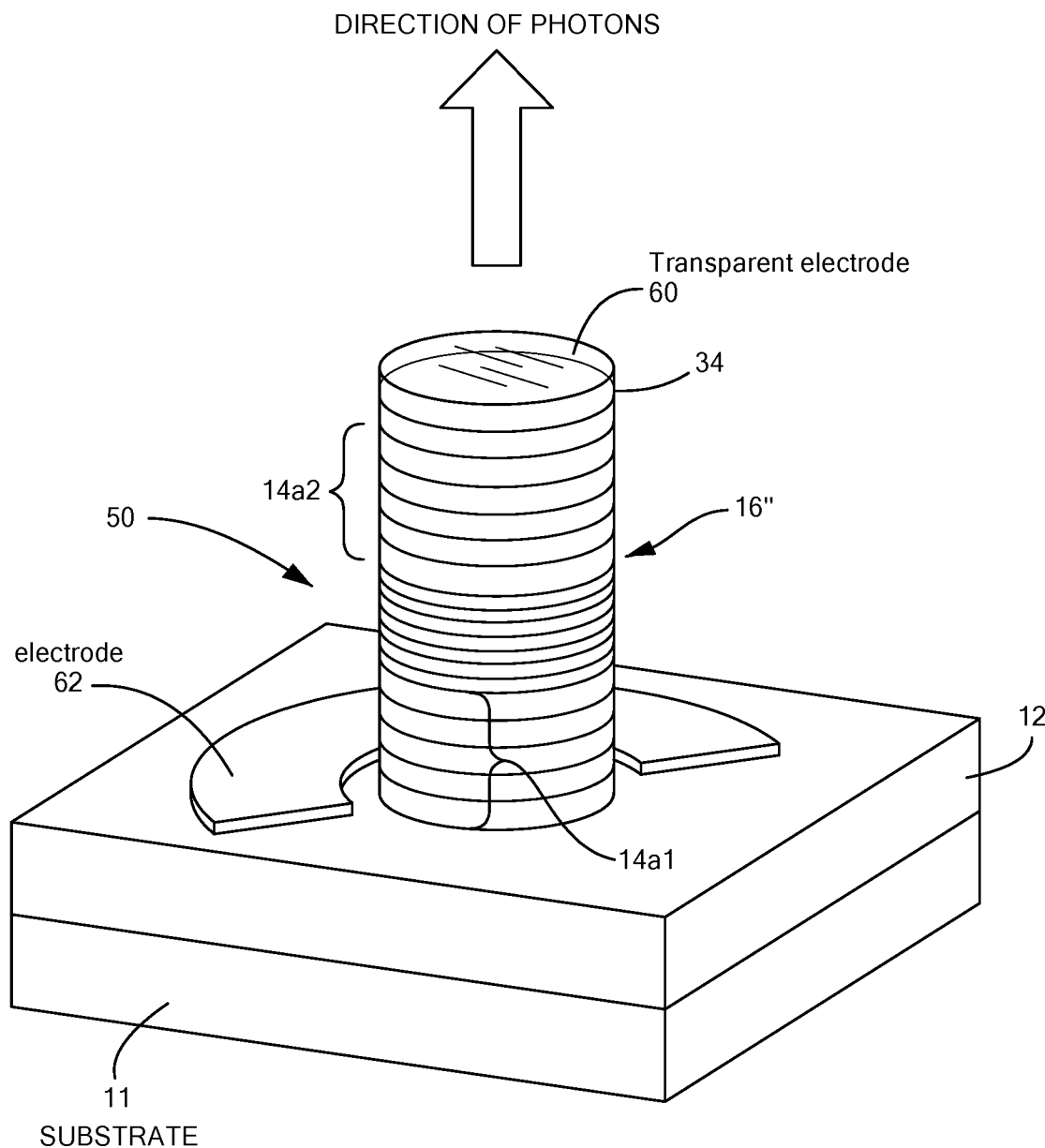
FIG. 8A is a simplified, diagrammatical, perspective sketch of a photonic device adapted for use with an out-of-plane modulator or laser according to another embodiment of the disclosure, such sketch showing a pair of cladding layer sections providing a pair of DBRs and a multiple quantum wells sandwiched between the pair of DBRs.
Figure 9:
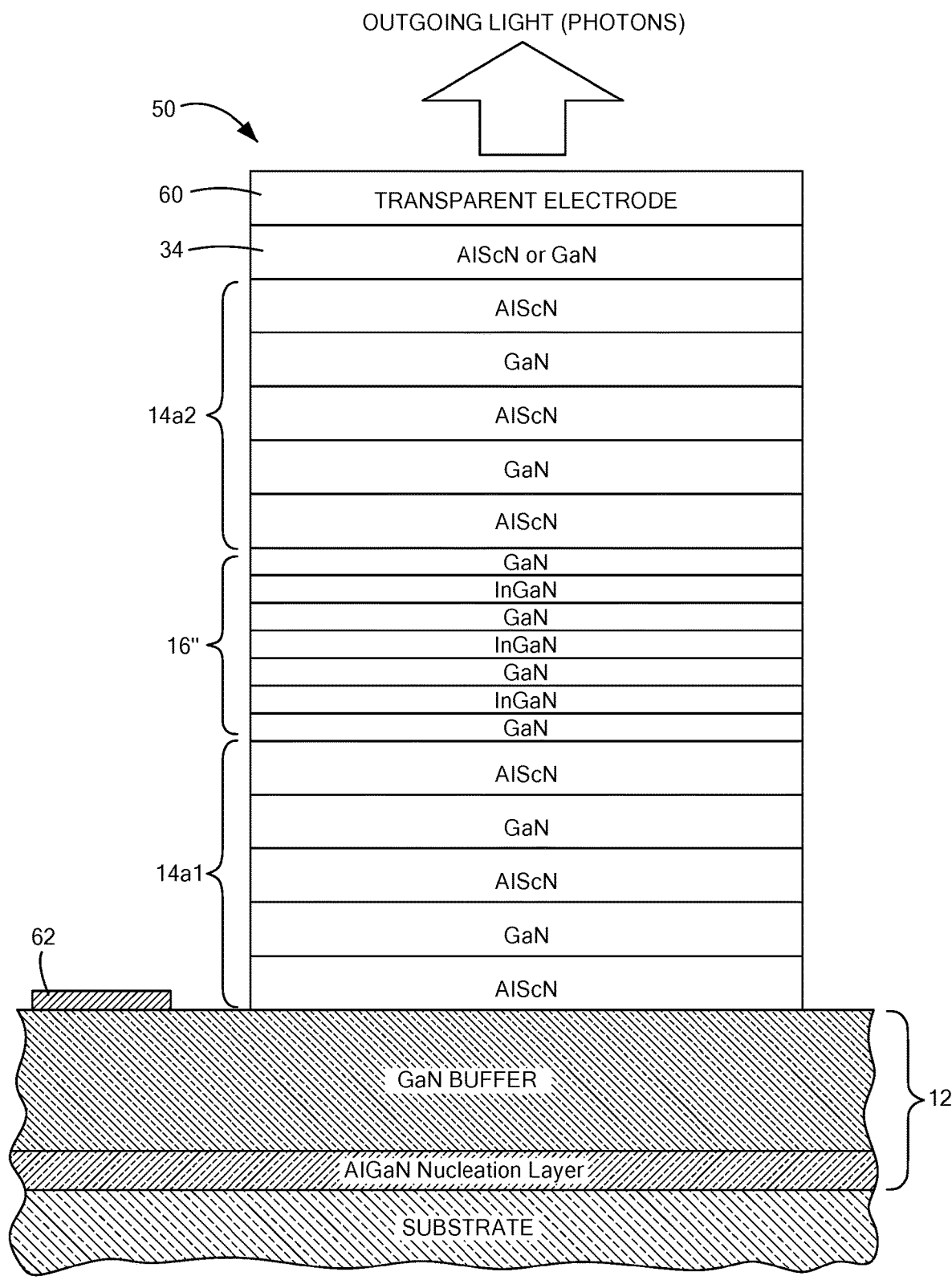
FIG. 9 is a simplified, diagrammatical, cross-sectional sketch of pair of DBRs and multiple wells of the out-of-plane modulator or laser of FIG. 8 according to the disclosure.

Referring now to FIGS. 8 and 8A, a photonic device, here a photonic waveguide device 50 is shown adapted to provide an out-of-plane modulator. It should be noted that the photonic waveguide device 50 may be used as a vertically emitting laser because, as noted above, an out-of-plane modulator and laser have similar generic structures. By starting from substrate 11, the AlGaN nucleation layer/GaN buffer layer 12 is formed. A pillar-like structure 52 is formed on the AlGaN nucleation layer/GaN buffer layer. A photonic waveguiding layer 16" for the photonic waveguide device 50 disposed between a pair of DBRs provided by a periodic stack of GaN/AlScN cladding layer sections 14a1 and 14a2; it being noted that here, only two periodic stacks of cladding layer sections are shown for simplicity. The photonic waveguiding layer 16", here a quantum well structure 16", here a stack of alternating GaN and InGaN (GaN/InGaN) layers epitaxially grown successively on the a lower DBR cladding section 14a1; and an upper cladding DBR 14a2, here a stack of alternating layers of GaN and AlScN (GaN/AlScN) layers, epitaxially grown successively on the photonic waveguiding layer 16" stack of GaN/InGaN layers, as shown more clearly in FIG. 9. Thus, it is noted that the pillar-like structure 52 includes a photonic waveguiding layer 16" having the stack of GaN/InGaN layers of the quantum well structure 16" sandwiched between a pair of cladding layer sections 14a1, 14a2, each one of the cladding layer sections 14a1, 14a2 having the stack of GaN/AlScN layers providing the upper and lower DBRs 14a1, 14a2, respectively.

Next, a top AlScN cladding layer 34 is epitaxially grown on the upper DBR cladding section 14a2. Subsequent steps of ion implantation doping, lithography, etching and metallization will define the modulator or the laser structure. It is noted that the pillar-like structure 52 is a vertical modulator and may be used to form a vertical emitting laser (both have similar generic structures). The three dimensional structure has the shape of a pillar-like structure 52 usually. On top of the pillar-like structure 52 is a transparent electrode 60 (so that the light, having a direction perpendicular to the layers of the pillar-like structure 52, can get in and out of the pillar-like structure 52) and the other electrode 62 is on the side of the pillar-like structure 52; more particularly on a portion of the AlGaN nucleation layer/GaN buffer layer 12 outside of the pillar-like structure 52. These electrodes 60, 62 may be used receive a voltage from an electrical source 82 (FIG. 8) to pump the quantum well structure, photonic waveguiding layer 16" and thereby generate photons within the photonic waveguiding layer 16" as when used as a laser or the voltage may be used to pump the waveguiding layer 16" and by modulating the control signal from the source 82 modulate photons generated in the photonic waveguiding layer 16" and then propagate the generated photons through the photonic waveguiding layer 16". Here, photons propagate along a direction perpendicular to the DBRs 14a1, 14a2, as shown; note that the GaN/InGaN quantum well photonic waveguiding layer 52 are sandwiched between DBRs 14a1 and 14a2 of GaN/AlScN which provide cladding layers for the photonic waveguide device 50.

It is noted that cladding layer 14 may, as described above, be AlScN or GaN. Also the top cladding layer 34 right above the top DBR 16a2 can be GaN or AlScN. For the versatility of the fabrication, the process starts with a commercial GaN template on SiC or sapphire-substrate. Then the $Al_{1-x}Sc_xN$ (with appropriate x composition) which is closely lattice matched to GaN is grown. Then the DBR 16a1, and the quantum layers 16" are grown, as described above. It is noted that the AlScN top cladding layer 34 is optional. Lithography and etching are used to define the pillar-like structure 32. The fabrication process also involves the steps of ion implantation doping and metallization for electrodes 40, 42, to define the final structure in FIGS. 8A and 9.

A number of embodiments of the disclosure have been described. Nevertheless, it will be understood that various modifications may be made without departing from the spirit and scope of the disclosure. For example, some of the modifications include changing x and y in $Al_xSc_{1-x}N$ and $Al_yGa_{1-y}N$ and/or changing the thickness of these material layers for optimal operation at a specific wavelength range. Further, it should be understood that the phrase "disposed on" includes and any arrangement; for example, the phrase "the waveguiding layer is disposed on the $Al_{1-x}Sc_xN$ cladding layer" includes any arrangement between the waveguiding layer and the $Al_{1-x}Sc_xN$ cladding layer including the $Al_{1-x}Sc_xN$ cladding layer being on any surface of the waveguiding layer including, for example, the top surface, bottom surface, or a side surface of the waveguiding layer. Accordingly, other embodiments are within the scope of the following claims.

What is claimed is:

1. A photonic device comprising: a Group III-Nitride quantum well electro-optic modulator, the modulator comprising:
    a Group III-Nitride quantum well photonic waveguiding layer; and
    a cladding layer comprising an $Al_{1-x}Sc_xN$, where $0<x\leq0.45$, the cladding layer disposed on the Group III-Nitride quantum well photonic waveguiding layer providing a lower refractive index at the operating wavelength of the photonic device to the Group III-Nitride while also providing a crystalline lattice matching layer to the Group III-Nitride quantum well photonic waveguiding layer.

2. A Group III-Nitride quantum well electro-optic modulator, comprising:
  a Group III-Nitride quantum well photonic waveguiding layer; and
  a cladding layer comprising an $Al_{1-x}Sc_xN$ disposed on the Group III-Nitride quantum well photonic waveguiding layer providing a lower refractive index at the operating wavelength of the photonic device to the Group III-Nitride while also providing a crystalline lattice matching layer to the Group III-Nitride quantum well photonic waveguiding layer and where $0<x\leq0.45$.

3. A Group III-Nitride quantum well electro-optic modulator comprising,
  a Group III-Nitride quantum well photonic waveguiding layer with in-plane light propagation; and
  a cladding layer, such cladding layer comprising $Al_{1-x}Sc_xN$ disposed on the Group III-Nitride quantum well photonic waveguiding layer providing a lower refractive index at the operating wavelength of the photonic device to the Group III-Nitride while also providing a crystalline lattice matching layer to the Group III-Nitride quantum well photonic waveguiding layer and where $0<x\leq0.45$.

4. The Group III-Nitride quantum well electro-optic modulator recited in claim 3 wherein the Group III-Nitride quantum well photonic waveguiding layer comprises a stack of $Al_yGa_{1-y}N$ and $In_zGa_{1-z}N$ layers where $0<z\leq1$ and $0\leq y\leq1$.

5. A Group III-Nitride quantum well electro-optic modulator having: a photonic waveguiding layer; and cladding layer disposed on the photonic waveguiding layer, the cladding layer comprising $Al_{1-x}Sc_xN$, where: $0<x\leq0.45$ and the photonic waveguiding layer comprises a stack of $Al_yGa_{1-y}N$ and $In_zGa_{1-z}N$ layers where $0<z\leq1$ and $0\leq y\leq1$.

6. The photonic device recited in claim 1 wherein the Group III-Nitride quantum well photonic waveguiding layer comprises a stack of $Al_yGa_{1-y}N$ and $In_zGa_{1-z}N$ layers where $0<z\leq1$ and $0\leq y\leq1$.

7. The photonic device recited in claim 1 comprising a second cladding layer comprising $Al_{1-x}Sc_xN$ wherein the Group III-Nitride quantum well photonic waveguiding layer is disposed between the cladding layer and the second cladding layer.

8. The Group III-Nitride quantum well electro-optic modulator recited in claim 2 wherein the Group III-Nitride quantum well photonic waveguiding layer comprises a stack of $Al_yGa_{1-y}N$ and $In_zGa_{1-z}N$ layers where $0<z\leq1$ and $0\leq y\leq1$.

9. The Group III-Nitride quantum well electro-optic modulator recited in claim 2 comprising a second cladding layer comprising $Al_{1-x}Sc_xN$ wherein the Group III-Nitride quantum well photonic waveguiding layer is disposed between the cladding layer and the second cladding layer.

10. The Group III-Nitride quantum well electro-optic modulator recited in claim 2 wherein the cladding layer comprises a stack of GAN/InScN layers.

11. The Group III-Nitride quantum well electro-optic modulator recited in claim 10 wherein the cladding layer and the second classing layer each comprises a stack of GAN/InScN layers.

* * * * *